United States Patent
Hasler et al.

(10) Patent No.: US 8,054,687 B2
(45) Date of Patent: Nov. 8, 2011

(54) SYSTEMS AND METHODS OF PROVIDING PROGRAMMABLE VOLTAGE AND CURRENT REFERENCE DEVICES

(75) Inventors: Paul E. Hasler, Atlanta, GA (US); Venkatesh Srinivasan, Atlanta, GA (US); Guillermo J. Serrano, Atlanta, GA (US); Christopher M. Twigg, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 28 days.

(21) Appl. No.: 12/691,653

(22) Filed: Jan. 21, 2010

(65) Prior Publication Data
US 2010/0246267 A1 Sep. 30, 2010

Related U.S. Application Data

(63) Continuation of application No. 12/108,196, filed on Apr. 23, 2008, now abandoned.

(60) Provisional application No. 60/913,362, filed on Apr. 23, 2007.

(51) Int. Cl.
*G11C 16/04* (2006.01)

(52) U.S. Cl. ......... 365/185.05; 365/185.15; 365/185.18; 365/185.28

(58) Field of Classification Search ............ 365/185.05, 365/185.01, 185.07, 185.18, 185.1, 185.2, 365/185.21, 185.26
See application file for complete search history.

(56) References Cited

U.S. PATENT DOCUMENTS

| 7,212,446 | B2 * | 5/2007 | Diorio et ............... 365/185.21 |
| 7,221,596 | B2 | 5/2007 | Pesavento et al. |
| 7,269,046 | B2 | 9/2007 | Graham et al. |
| 7,283,390 | B2 | 10/2007 | Pesavento |
| 2005/0063235 | A1 * | 3/2005 | Pesavento et al. ............ 365/222 |
| 2007/0007999 | A1 * | 1/2007 | Graham et al. ............... 326/38 |
| 2008/0175050 | A1 | 7/2008 | Pesavento et al. |
| 2008/0205150 | A1 | 8/2008 | Pesavento |

* cited by examiner

*Primary Examiner* — Gene N. Auduong
(74) *Attorney, Agent, or Firm* — Ryan A. Schneider, Esq.; Trenton A. Ward, Esq.; Troutman Sanders LLP

(57) ABSTRACT

The present invention describes systems and methods to for providing stable and programmable voltage and current reference devices. An exemplary embodiment of the present invention provides a voltage reference device having a first floating-gate transistor with a first source, a first drain, and a first gate. The first gate is provided coupled to a first programming capacitor and a first input capacitor. Furthermore, the voltage reference device includes a second floating-gate transistor having a second source, a second drain, and a second gate. The second gate is provided coupled to a second programming capacitor and a second input capacitor. Additionally, the charge difference between the first floating-gate transistor and the second floating-gate transistor is a reference voltage.

18 Claims, 20 Drawing Sheets

SYSTEMS AND METHODS OF PROVIDING PROGRAMMABLE VOLTAGE AND CURRENT REFERENCE DEVICES

CROSS REFERENCE TO RELATED APPLICATION

This application is a continuation of U.S. patent application Ser. No. 12/108,196, filed 23 Apr. 2008, which is identified by the title "Floating-Gate Based Programmable CMOS Reference," which claims the benefit of U.S. Provisional Patent Application Ser. No. 60/913,362 filed 23 Apr. 2007. The entire contents and substance of the above-cited documents are hereby incorporated by reference as if fully set forth below.

FIELD OF THE INVENTION

The present invention relates generally to systems and methods for providing voltage and current references, more particularly, to systems and methods for providing stable and programmable voltage and current reference devices.

BACKGROUND OF THE INVENTION

An ideal voltage reference is an electronic device that ideally produces a fixed voltage irrespective of the loading on the device, power supply variation and temperature. Voltage references are critical components in both analog and digital systems. The accuracy, temperature sensitivity and drift of references impact the performance of many circuit blocks such as analog-to-digital converters, digital-to-analog converters and power management circuitry. The ever decreasing scale of transistors now requires lower reference voltages, such as below 1 volt. Additionally, these voltage references must have low temperature sensitivity and high initial accuracy.

One of the most commonly used conventional voltages references in integrated circuits is the bandgap voltage reference. A bandgap-based reference uses analog circuits to add a multiple of the voltage difference between two bipolar junctions biased at different current densities to the voltage developed across a diode. The diode voltage has a negative temperature coefficient (i.e. it decreases with increasing temperature), and the junction voltage difference has a positive temperature coefficient. When added in the proportion required to make these coefficients cancel out, the resultant constant value is a voltage equal to the bandgap voltage of the semiconductor. In silicon, the bandgap voltages is approximately 1.25V. Typically, the bandgap reference is designed to achieve a first order temperature cancellation that gives a zero temperature coefficient at a particular temperature.

Although sufficient for some applications, the conventional bandgap voltage reference restricts the reference voltage to that of the energy bandgap of silicon (1.25V). Therefore, the conventional bandgap voltage reference is insufficient for applications requiring a reference voltage below 1 volt ("sub-1V").

BRIEF SUMMARY OF THE INVENTION

The present invention describes systems and methods to provide providing stable and programmable voltage and current reference devices. An exemplary embodiment of the present invention provides a voltage reference device having a first floating-gate transistor with a first source, a first drain, and a first gate. The first gate is provided coupled to a first programming capacitor and a first input capacitor. Furthermore, the voltage reference device includes a second floating-gate transistor having a second source, a second drain, and a second gate. The second gate is provided coupled to a second programming capacitor and a second input capacitor. Additionally, the charge difference between the first floating-gate transistor and the second floating-gate transistor is a reference voltage.

In addition to voltage and current reference devices, the present invention provides methods for programming a voltage reference device. An exemplary embodiment of a method for programming a voltage reference device involves inserting charge into a first floating-gate transistor including a first source, a first drain, and a first gate, and the first gate is coupled to a first programming capacitor and a first input capacitor. Furthermore, the method for programming a voltage reference device involves inserting charge into a second floating-gate transistor including a second source, a second drain, and a second gate, and the second gate is coupled to a second programming capacitor and a second input capacitor. Additionally, the method for programming a voltage reference device involves measuring a reference voltage by determining a charge difference between the first floating-gate transistor and the second floating-gate transistor.

These and other objects, features and advantages of the present invention will become more apparent upon reading the following specification in conjunction with the accompanying drawing figures.

DETAILED DESCRIPTION OF PREFERRED EMBODIMENTS

Figure 1:
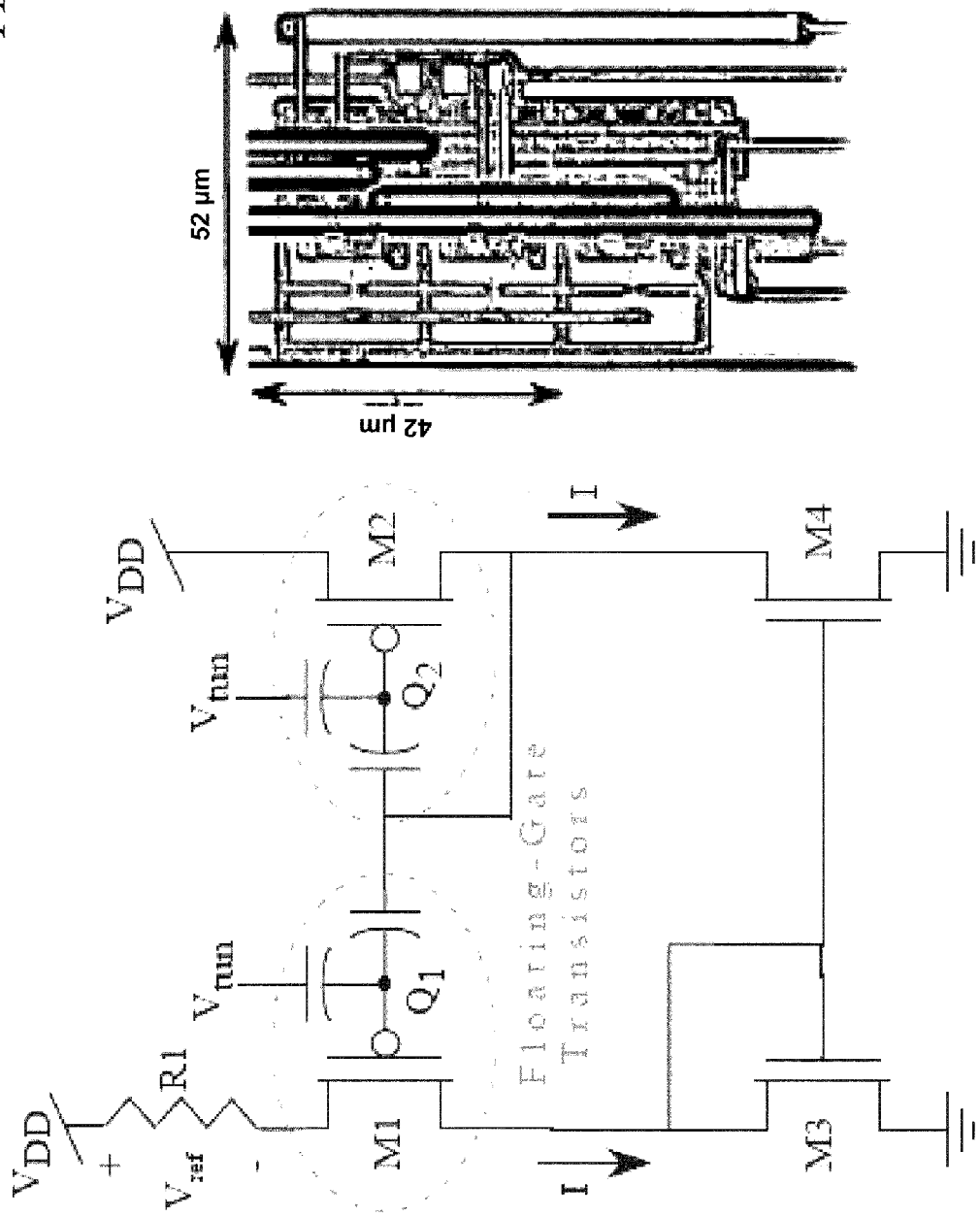
FIG. 1 provides an illustration of a circuit representation of the voltage reference device 100 and a die photograph of the voltage reference device 100 provided in accordance with an exemplary embodiment of the present invention.

The present invention addresses the deficiencies in the prior art concerning the inability of prior art device to provide a stable known voltage reference. Significantly, the present invention provides methods and apparatus for providing a stable programmable voltage reference. Additionally, a programmable voltage reference provided in accordance with the present invention is enabled to display a low temperature co-efficient and be suited for operation at a low supply voltage. Additionally, the present invention overcomes the drawbacks of the conventional methods and systems in the prior art and provides systems and methods enabled to provide a compact programmable voltage-reference based on the charge difference between two floating-gate transistors.

An exemplary embodiment of the present invention provides a voltage reference device having a first floating-gate transistor with a first source, a first drain, and a first gate. The first gate is provided coupled to a first programming capacitor and a first input capacitor. Furthermore, the voltage reference device includes a second floating-gate transistor having a second source, a second drain, and a second gate. The second gate is provided coupled to a second programming capacitor and a second input capacitor. Additionally, the charge difference between the first floating-gate transistor and the second floating-gate transistor is a reference voltage.

In addition to voltage reference devices, the present invention provides methods for programming a voltage reference device. An exemplary embodiment of a method for programming a voltage reference device involves inserting charge into a first floating-gate transistor including a first source, a first drain, and a first gate, and the first gate is coupled to a first programming capacitor and a first input capacitor. Furthermore, the method for programming a voltage reference device involves inserting charge into a second floating-gate transistor including a second source, a second drain, and a second gate, and the second gate is coupled to a second programming capacitor and a second input capacitor. Additionally, the method for programming a voltage reference device involves measuring a reference voltage by determining a charge difference between the first floating-gate transistor and the second floating-gate transistor.

While the term "voltage reference device" is used herein to describe certain exemplary embodiments of the present invention, the present invention is also directed to current reference devices. One of the significant advantages provided by the voltage reference in accordance with the present invention is the ability to provide an accurate reference at voltages below 1 volt ("sub-1V") with relatively low long-term drift and low temperature sensitivity. As voltage reference are critical components in both analog and digital systems, the accuracy, temperature sensitivity and drift of references impact the performance of many circuit blocks such as analog-to-digital converters, digital-to-analog converters, and power management circuitry. With the recent trends in transistor scaling, the need for a sub-1V reference with low temperature sensitivity and high initial accuracy is growing. Many conventional bandgap voltage references have been implemented with Bipolar Junction Transistors ("BJT"s) and provide first-order temperature cancellation. These BJTs based voltage references, however, restrict the reference voltage to the energy bandgap of silicon, around 1.25 Volts, and therefore are unable to provide a sub-1V reference. Other conventional voltage references have been implemented in attempt to provide a sub-1V reference, but many of these references require post-fabrication modification and can only provide a reference at one voltage value.

An exemplary embodiment of the voltage reference provided reference in accordance with the present invention relies upon the non-volatile memory of floating-gate transistor as the source of the reference voltage. The floating-gate transistor enables an exemplary embodiment of the voltage reference to be programmable in relatively wide range of voltages. Furthermore, the use of a floating-gate transistor in an exemplary embodiment of the voltage reference enables the reference to relatively insensitive to temperature of other environmental effects. An exemplary embodiment of the floating-gate transistor based voltage reference further results in a high initial accuracy for the reference.

FIG. 1 provides an illustration of a circuit representation of the voltage reference device 100 and a die photograph of the voltage reference device 100 provided in accordance with an exemplary embodiment of the present invention. The die photograph of the voltage reference device 100 that provided illustrates an exemplary embodiment fabricated and characterized in a 0.35 μm CMOS process.

Figure 2A:
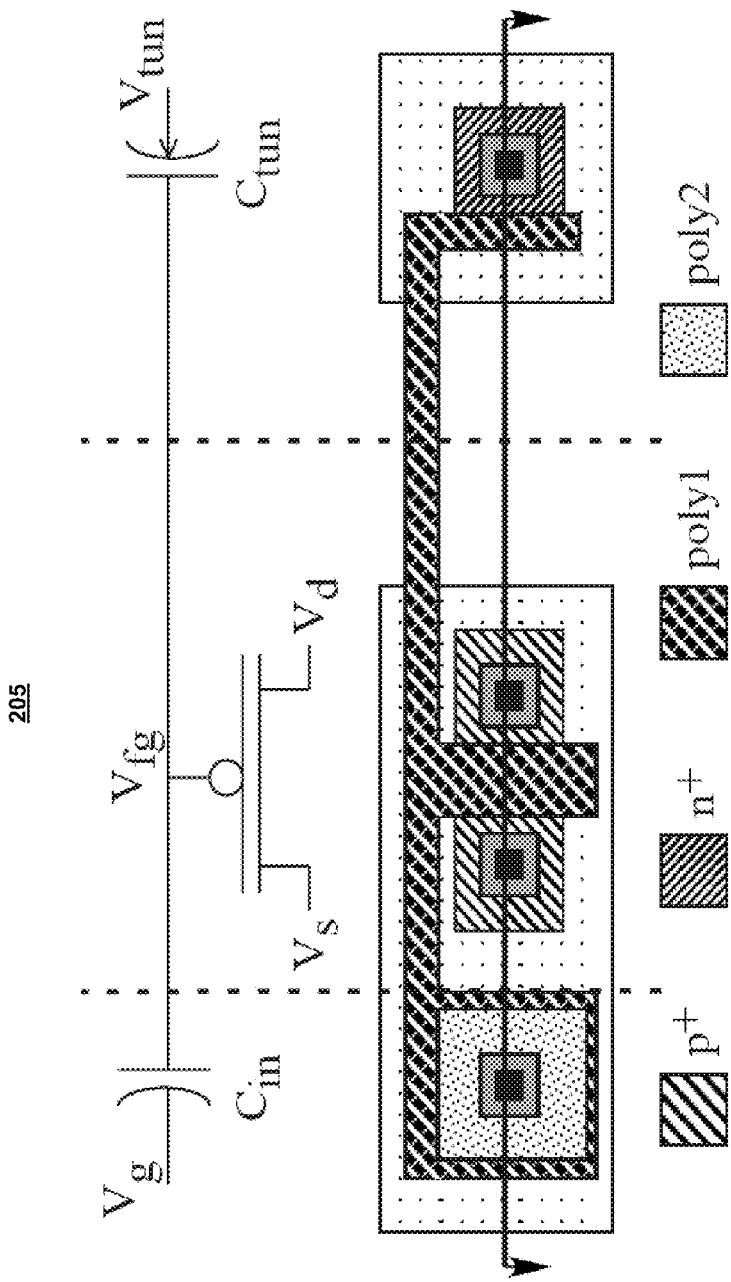
FIG. 2A provides an illustration of the layout and circuit schematic of a pFET floating-gate transistor 205 in a standard digital CMOS process as used in an exemplary embodiment of the voltage reference device 100.

FIG. 2A provides an illustration of the layout and circuit schematic of a pFET floating-gate transistor 205 in a standard digital CMOS process as used in an exemplary embodiment of the voltage reference device 100. As shown in the exemplary embodiment in FIG. 2A, the transistor inputs can be capacitively coupled through an input capacitor ("$C_{in}$") and a tuning capacitor ("$C_{tun}$"). The configuration of the floating-gate transistor 205 couple through Cin and Ctun enables the storage of charge in the floating-gate transistor 205. Floating-gate transistors such as floating-gate transistor 205, can be implemented with their polysilicon gate surrounded by a high quality insulator such as $SiO_2$. The isolation of the polysilicon gate can deter the leakage of stored charge on the floating-gate, thereby providing non-volatile charge storage capability.

As shown in FIG. 2A, the external inputs of the floating-gate transistor 205 of an exemplary embodiment of the voltage reference device 100 can be capacitively coupled through an input capacitor $C_{in}$ to aid in maintaining the non-volatile storage of the floating gate. In the exemplary embodiment shown in FIG. 2A, the second polysilicon layer can be used primarily to implement the input capacitor. The tunneling junction shown in the exemplary embodiment in FIG. 2A to the right of the second polysilicon layer can be implemented using the gate oxide. Assuming that a charge of Q is stored on the floating-gate transistor 205 in an exemplary embodiment, the floating-gate voltage, $V_{fg}$, can be given by:

$$V_{fg} = \left(\frac{C_{in}}{C_t}\right)V_g + \frac{Q}{C_t} \qquad (1)$$

where, $C_T$ is the total capacitance at the floating-node, and Q is the charge stored at the floating-gate node. The effective threshold voltage of the device is modified by $Q/C_T$.

Programming the floating-gate transistor 205 involves adding or removing charge from the floating-gate thereby modulating the effective threshold voltage of the device. In an exemplary embodiment, the voltage reference device 100 can be programmed to be completely turned off for all gate voltages or can be programmed to be in the depletion-mode. The physical phenomena of hot-electron injection and Fowler-Nordheim tunneling can be used to modify charge on a floating-gate transistor. Hot-electron injection adds electrons to the floating-gate while Fowler-Nordheim tunneling can be used to both add and remove electrons depending on the polarity of the applied tunneling voltage with respect to the floating-gate voltage.

In an exemplary embodiment of the voltage reference device 100, tunneling can be used as a global erase to remove electrons and can be achieved by capacitive coupling through $C_{tun}$ by applying a sufficiently high voltage. After a global erase, precision programming can be achieved in an exemplary embodiment through hot-electron injection by adding electrons as required onto the floating-gate transistor 205. Programming of the floating-gate transistor of an exemplary embodiment of the voltage reference device 100 can be achieved by modifying its charge. In an exemplary embodiment, hot-electron injection and Fowler-Nordheim tunneling can be used to add and remove electrons from the floating-gate transistor 205, respectively. In an exemplary embodiment, the injection can be performed with a 3.3 V or more drain-to-source voltage across the transistor 205 and tunneling requires 8V or more across the tunneling capacitor for 0.35 µm CMOS process. In an exemplary embodiment of the voltage reference device 100, tunneling can be used as a global erase and injection can be used for accurate programming. Automatic and precise programming of an exemplary embodiment of the voltage reference device 100 can be achieved through the algorithm proposed in A. Bandyopadyay, G. Serrano, and P. Hasler, "Programmaing analog computational elements to 0.2% accuracy over 3.5 decades using a predictive method," Proceedings of the International Symposium on Circuits and Systems, pp. 2148-2151, May 2005.

Figure 2B:
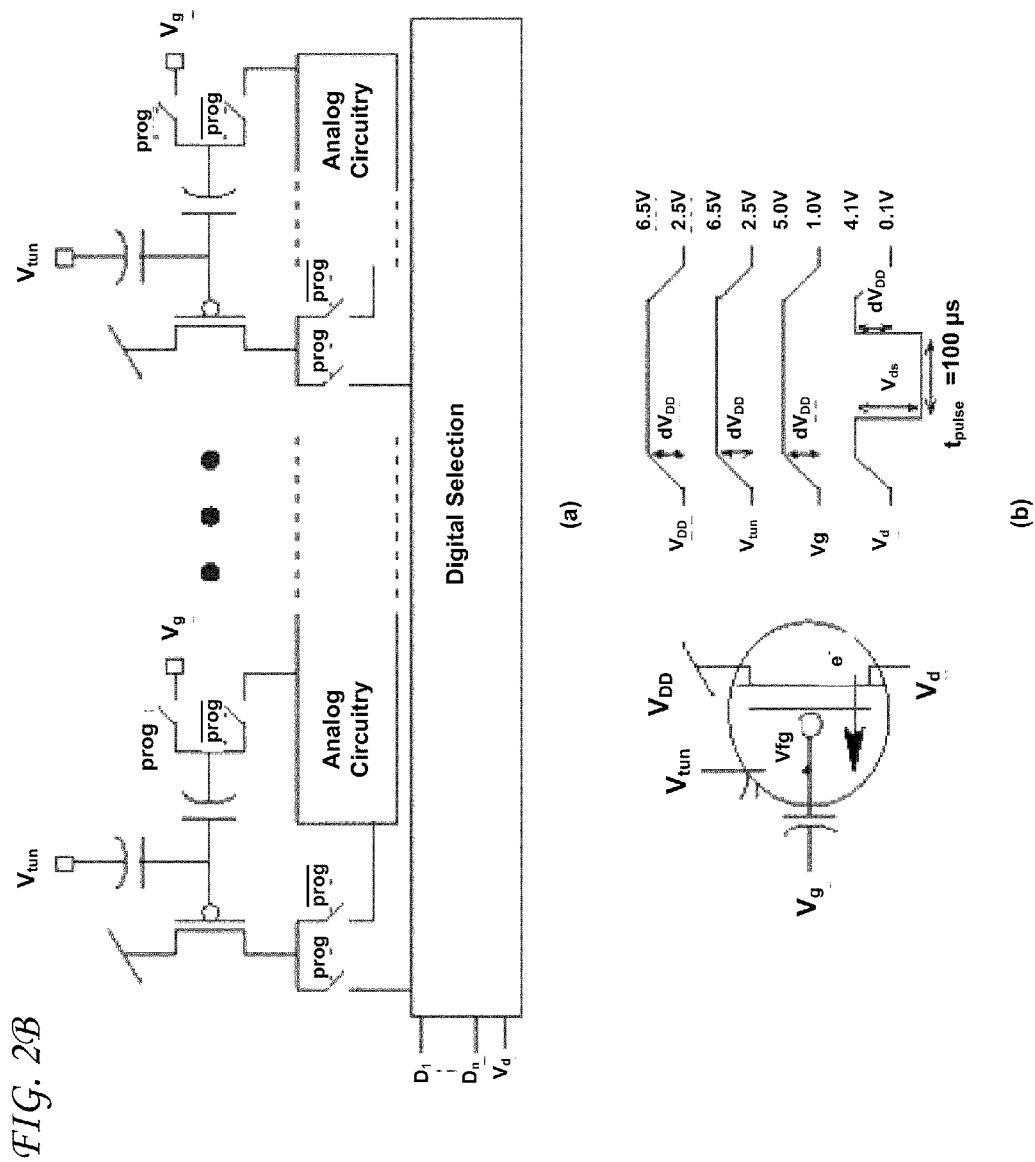
FIG. 2B shows the use of multiple floating-gate transistors 205 in an exemplary embodiment as part of analog circuitry.

FIG. 2B shows the use of multiple floating-gate transistors 205 in an exemplary embodiment as part of analog circuitry. During normal operation, or the run-mode, an exemplary embodiment of the voltage reference device 100 can be operated with a 2.5 V supply voltage and a digital low can be applied to the program terminal such that the floating-gate transistors 205 are part of the analog circuitry. Programming a floating-gate transistor 205 in an exemplary embodiment using hot-electron injection can be achieved by first isolating the floating-gate transistor 205 from the rest of the circuitry such that the drain and gate terminals are accessible externally. In an exemplary embodiment, this programming mode for the floating-gate transistor 205 can be achieved by applying a digital high to the programming terminal thereby putting the floating-gate transistor 205 in the program-mode.

In an exemplary embodiment the programming infrastructure can be designed such that in program-mode, all the floating-gate transistors 205 share the same gate terminal and the drain of the floating-gate transistor of interest is connected to the external drain pin using digital selection circuitry. In this programming mode in an exemplary embodiment, the drains of the unselected floating-gate transistors 205 can be connected to the supply voltage. Additionally, in an exemplary embodiment, all the floating-gate transistors 205 can share the same tunneling voltage. In this exemplary embodiment configuration, multiple floating-gate transistor 205 can be programmed with minimum additional pin count. Pins $V_g$, $V_d$ and $V_{tun}$ can be the minimum required for programming a single floating-gate transistor an exemplary embodiment of the voltage reference device 100. In some embodiments, multiple floating-gate transistors 205 require additional digital signals for drain selection with the pin count minimized using a serial interface.

In an exemplary embodiment of the voltage reference device 100, the first step in the hot-electron injection process can be the chip ramp up procedure where the supply voltage is increased to a higher value of around 6.5 V. The bias voltages for the exemplary embodiment of the voltage reference device 100 can be increased with respect to the supply voltage as well. Hot-electron injection in an exemplary embodiment of the voltage reference device 100 can be achieved by biasing the floating-gate transistor 205 such that a drain current flows through the device and by pulsing the drain to a low voltage such that a large source-drain voltage, for example and not limitation of less 3V, appears across the device for a time interval. The number of electrons injected and hence the change in the drain current is a function of drain voltage and pulse interval; these required values are estimated from the relationship between the initial drain current and the desired target current. After hot-electron injection, the supply voltage and all other biases can be restored back to their normal operating values. In order to obtain a desired programming time and accuracy, the hot-electron injection in an exemplary embodiment can be characterized for a given process.

Using the characterization results, an automatic programming algorithm can be used in an exemplary embodiment for programming. The pulse width can be kept constant throughout the programming process in an exemplary embodiment. For example and not limitation, the pulse width can be held constant in an exemplary embodiment at 100 µs. In an exemplary embodiment, the voltage reference device 100 can then be ramped up and these pulses can then be applied to the floating-gate transistor 205 with the algorithm ramping down the voltage reference device 100, measuring the drain current at the end of each pulse and making changes if necessary to the source-drain voltage of the next pulse. In an exemplary embodiment, the programming algorithm can converge to a target current within 0.1% accuracy in 7-12 pulses.

Those of skill in the art will appreciate that some embodiments the programming algorithm can be designed to undershoot the target, primarily by the amount of measurement noise, to guarantee that the injection process does not overshoot the target value. Differential floating-gate structures can be used in an exemplary embodiment of the voltage reference device 100 to correct some overshoot errors by injecting the other device variability more to correct the error. If the value overshoots beyond the accuracy of the target value in an exemplary embodiment of the voltage reference device 100, the programming step must erase, using electron tunneling, the programmed values and start over; therefore it is advantageous to keep the algorithm from overshooting the target. As a benefit of more conservative programming approach in an exemplary embodiment towards the target current, the algorithm can provide some tolerance with potential variability of hot-electron injection parameters. The versatility of the programming algorithm provided for an exemplary embodiment of the voltage reference device 100, can enable the algorithm to work even over the variability sometimes seen in manufacturing.

Figure 3A:
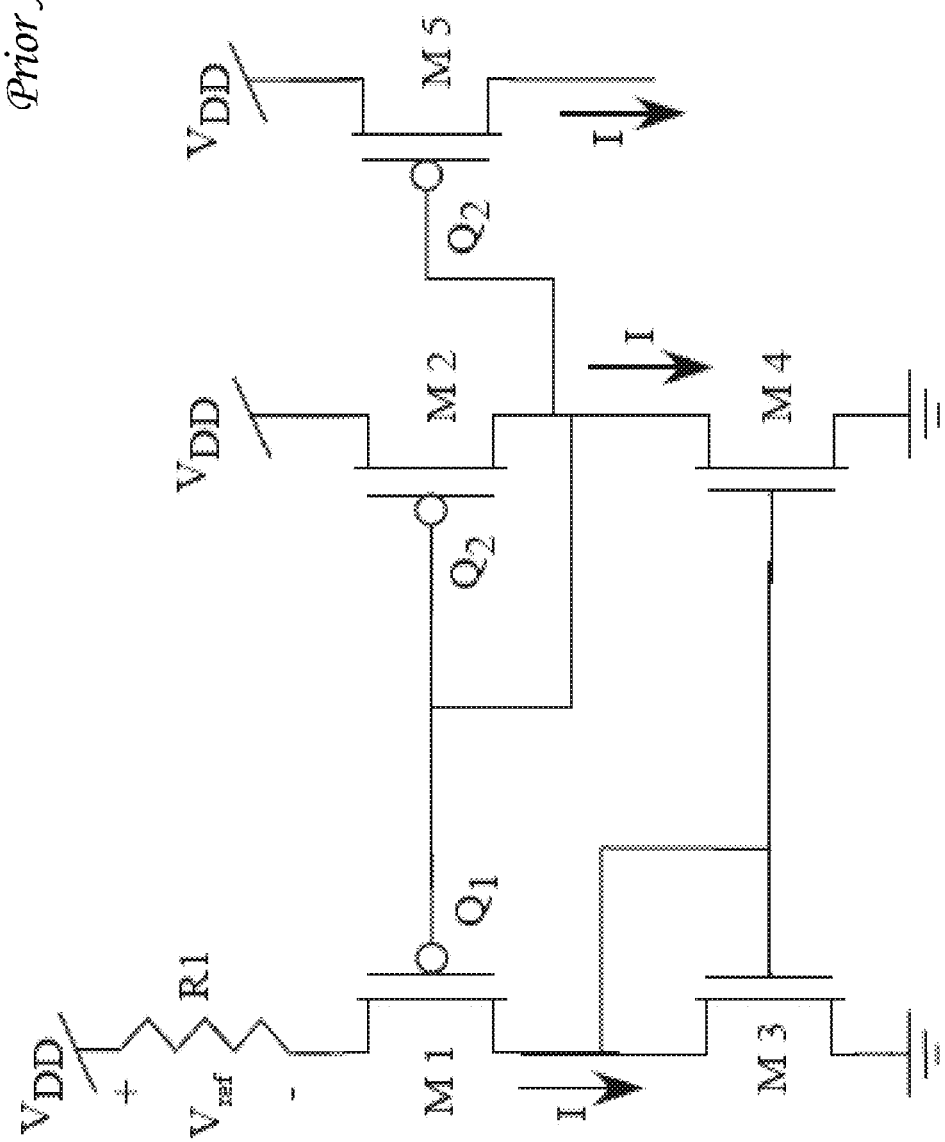
FIG. 3A shows a conventional bootstrap voltage reference.

FIG. 3A shows a conventional bootstrap voltage reference. The conventional boostrap reference shown in FIG. 3A provides a (W/L) ratio of M1 much larger than (W/L) ratio of M2 to create an imbalance in the source voltages leading to the reference voltage. For the conventional bootstrap circuit shown in FIG. 3a, the reference voltage at the source of M1 is generated to offset the increased (W/L) ratio of M1 compared to M2. For subthreshold currents with no additional transistor mismatch, $V_{ref}$ is:

$$V_{ref} = U_T \ln\left(\frac{(\frac{W}{L})M1}{(\frac{W}{L})M2}\right) \quad (2)$$

where $U_T$ is kT/q, resulting in a classic Proportional To Absolute Temperature (PTAT) reference.

Figure 3B:
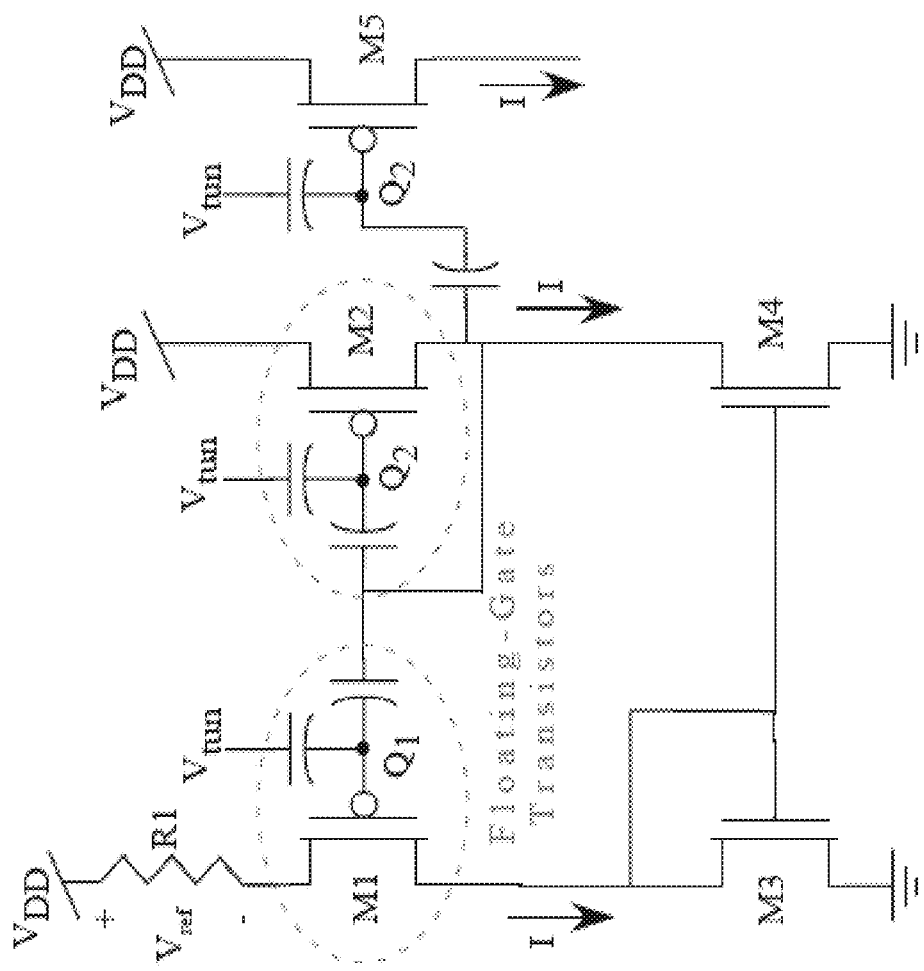
FIG. 3B provides an illustration of an exemplary embodiment of a voltage reference device 100 provided in accordance with the present invention that is programmable.

FIG. 3B provides an illustration of an exemplary embodiment of a voltage reference device 100 provided in accordance with the present invention that is programmable. As shown in FIG. 3B, floating-gate transistors M1 and M2 can be of equal size in an exemplary embodiment of the voltage reference device 100 and create the imbalance in the source voltages by programming a difference in the floating-gate voltages. Additionally, as shown in FIG. 3B, the exemplary embodiment of the voltage reference device 100 can include a current minor M3 and M4. The current mirror composed by M3 and M4 in an exemplary embodiment of the voltage reference device 100 can enable the currents through M1 and M2 to be identical, within mismatch effects, for both circuits. Thus an exemplary embodiment of the voltage reference device 100 utilizes the two currents that are roughly identical, and requires that $\kappa(V_{dd}-V_{fg}-V_T)-V_s$ of M1 and M2 can remain fixed independent whether the MOSFET is operating with subthreshold or above-threshold saturated currents. The threshold voltage can be defined as $V_T$, $V_{fg}$ as the capacitive coupling between the gate, and $\kappa$ as the transistor surface potential. Therefore, if $\kappa$ is identical in an exemplary embodiment, if the source and well of M1 are tied together for nearly identical currents:

$$V_{ref} = \kappa(V_{fg2}-V_{fg1}+(V_{T2}-V_{T1})) \quad (3)$$

where we program $V_{fg2}$, $V_{fg1}$ by setting the charge on these floating-gate nodes resulting in:

$$V_{fg2} - V_{fg1} = \frac{Q_{m2} - Q_{m1}}{C_T} \quad (4)$$

where QM1 and QM2 are the charges on the floating-gate node corresponding to M1 ad M2, respectively, and $C_T$ is assumed to be matched for both floating-gate devices in an exemplary embodiment.

Typical temperature coefficients for capacitors can be in the 50 ppm/° C. range, and therefore fairly small to first order. In an exemplary embodiment, the temperature dependence of threshold voltage mismatch ($V_{T2}-V_{T1}$) is negligible, because it is caused by charge storage imbalance in the oxide; the programming of the floating-gate devices directly accounts for this effect.

Figure 3C:
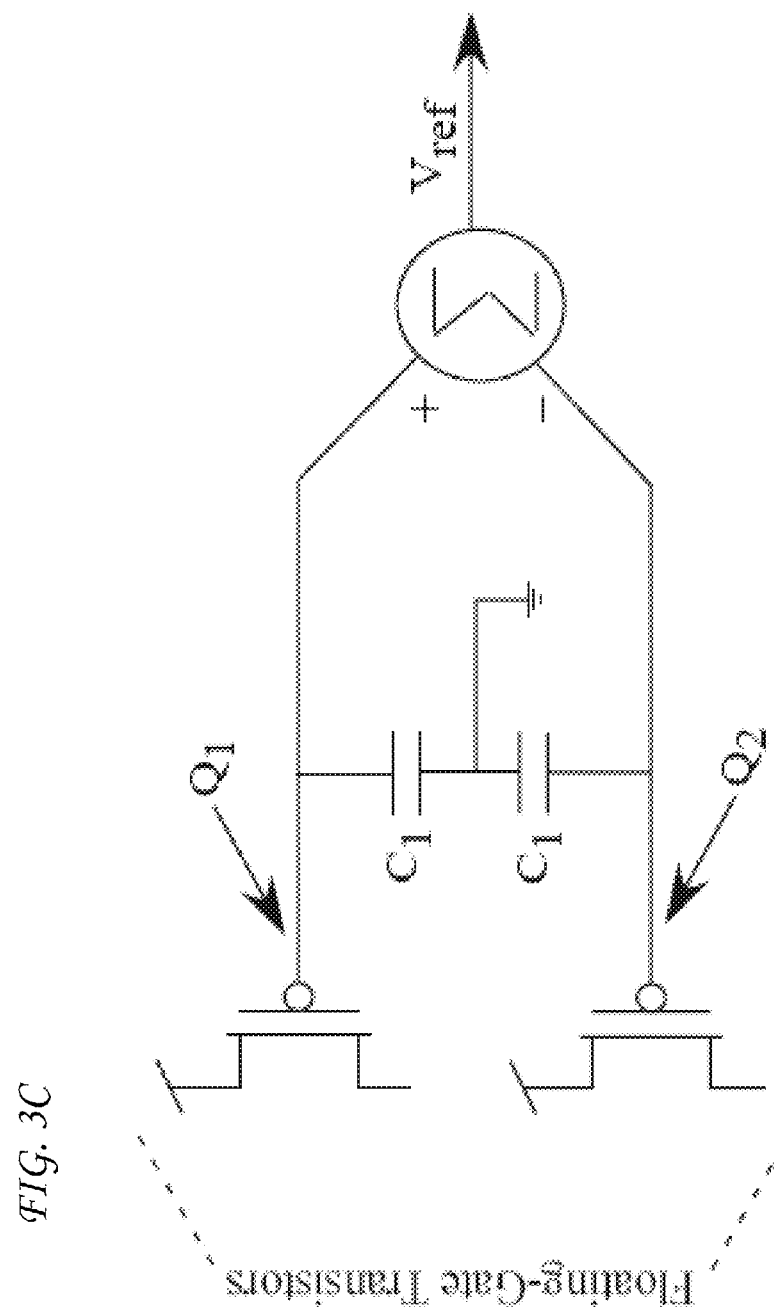
FIG. 3C illustrates the reference voltage of an exemplary embodiment of the voltage reference device 100 in accordance with the present invention.

FIG. 3C illustrates the reference voltage of an exemplary embodiment of the voltage reference device 100 in accordance with the present invention. As shown in FIG. 3C, the voltage reference of an exemplary embodiment of the voltage reference device 100 is dependent primarily on the difference of the programmed voltages, as illustrated in FIG. 3C. Furthermore, the temperature dependence of an exemplary embodiment of the voltage reference device 100 can be limited to the weak temperature dependence of $\kappa$. Thus, an exemplary embodiment of the voltage reference device 100 is insensitive to temperature to first order, and not proportional to temperature like a conventional voltage reference. By ratioing M1 and M2 in an exemplary embodiment of the voltage reference device 100, one can have an additive $U_T$ term that can be used to compensate for the resistor temperature effects. This design provides the flexibility of reprogramming and storing multiple reference voltage or current values with a low sensitivity to temperature after fabrication with a single design.

Figure 3D:
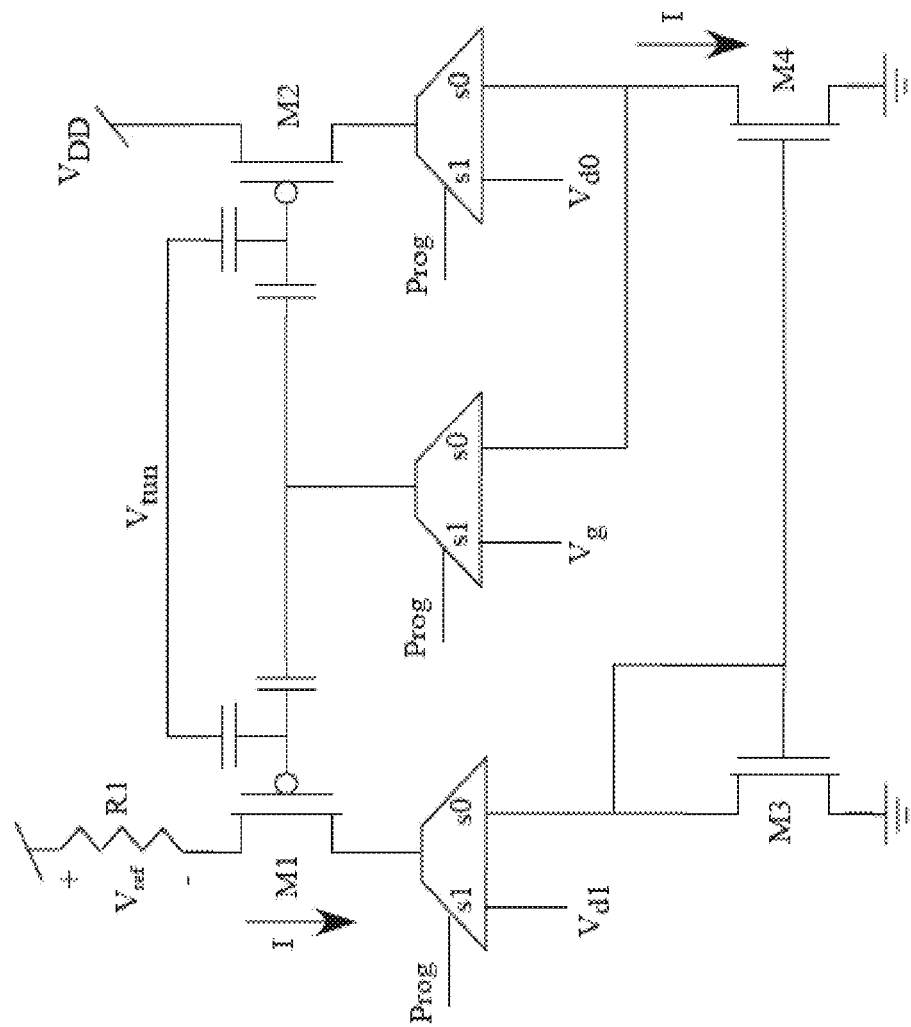
FIG. 3D shows the complete circuit for the voltage reference device 100 in accordance an exemplary embodiment of the present invention.

FIG. 3D shows the complete circuit for the voltage reference device 100 in accordance an exemplary embodiment of the present invention. The exemplary embodiment of the voltage reference device 100 shown in FIG. 3D can be designed to be a voltage reference with respect to $V_{dd}$. In an alternative embodiment, a ground referenced voltage reference device 100 can be provided by using nFET floating-gate transistors and utilizing indirect floating-gate programming techniques. FIG. 3D illustrates the complete circuit for an exemplary embodiment of the voltage reference device 100, including the transmission gates required to put this circuit into a standard programming infrastructure; if programming is already being used on the IC, then this voltage reference device 100 can require negligible amount of additional circuitry for programming. Further, switching the device from program mode (prog=1) to run mode (prog=0) can provide a stable startup condition for this exemplary embodiment of the voltage reference device 100 by providing sufficient current to operate in the desired stable state, and therefore no additional startup circuit is required assuming a power-on reset supplies a signal to the prog line.

Figure 4A:
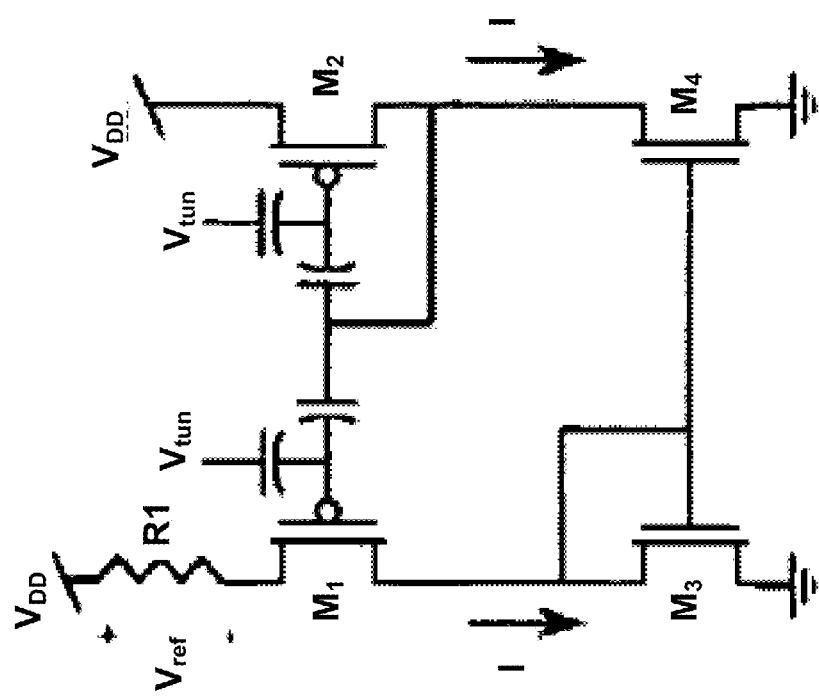
FIG. 4A provides a schematic of an exemplary embodiment of the voltage reference device 100.
Figure 4B:
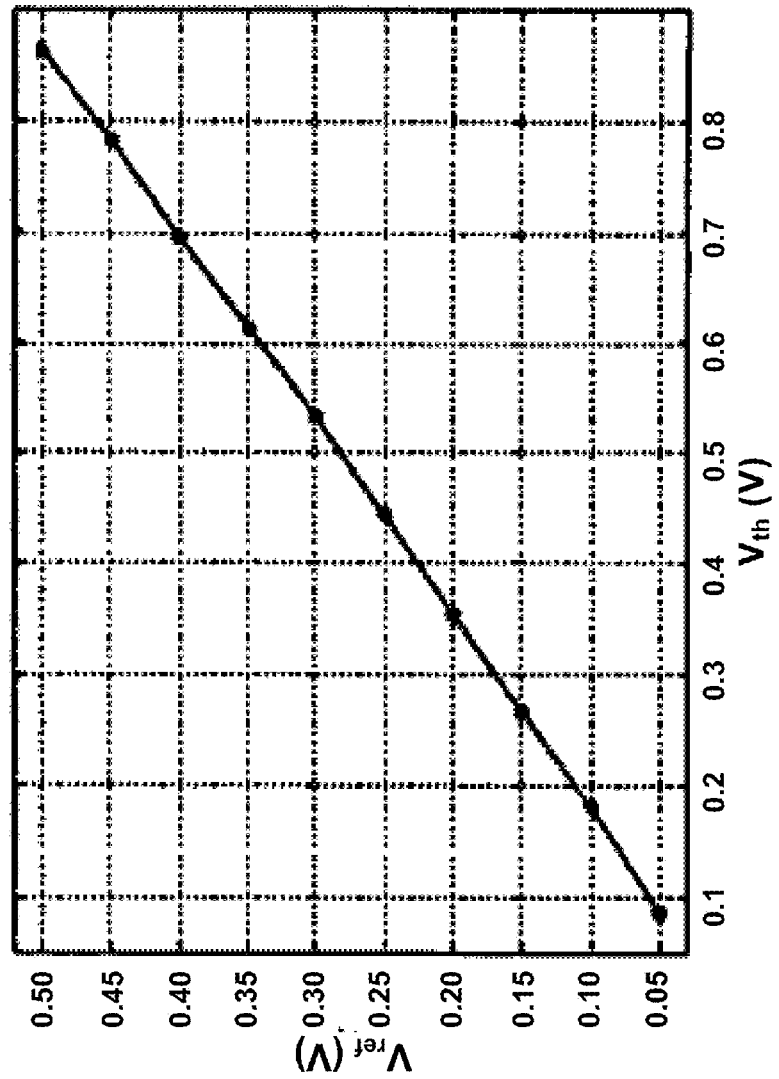
FIG. 4B shows a plot of the programmed reference voltage as a function of the threshold voltage difference between transistors M2 and M1 of an exemplary embodiment of the voltage reference device 100 for voltages ranging from 50 mV to 500 mV.

FIG. 4A provides a schematic of an exemplary embodiment of the voltage reference device 100. FIG. 4B shows a plot of the programmed reference voltage as a function of the threshold voltage difference between transistors M2 and M1 of an exemplary embodiment of the voltage reference device 100 for voltages ranging from 50 mV to 500 mV. The plot is linear with a slope of the $\kappa$ of the pFET devices.

Figure 4C:
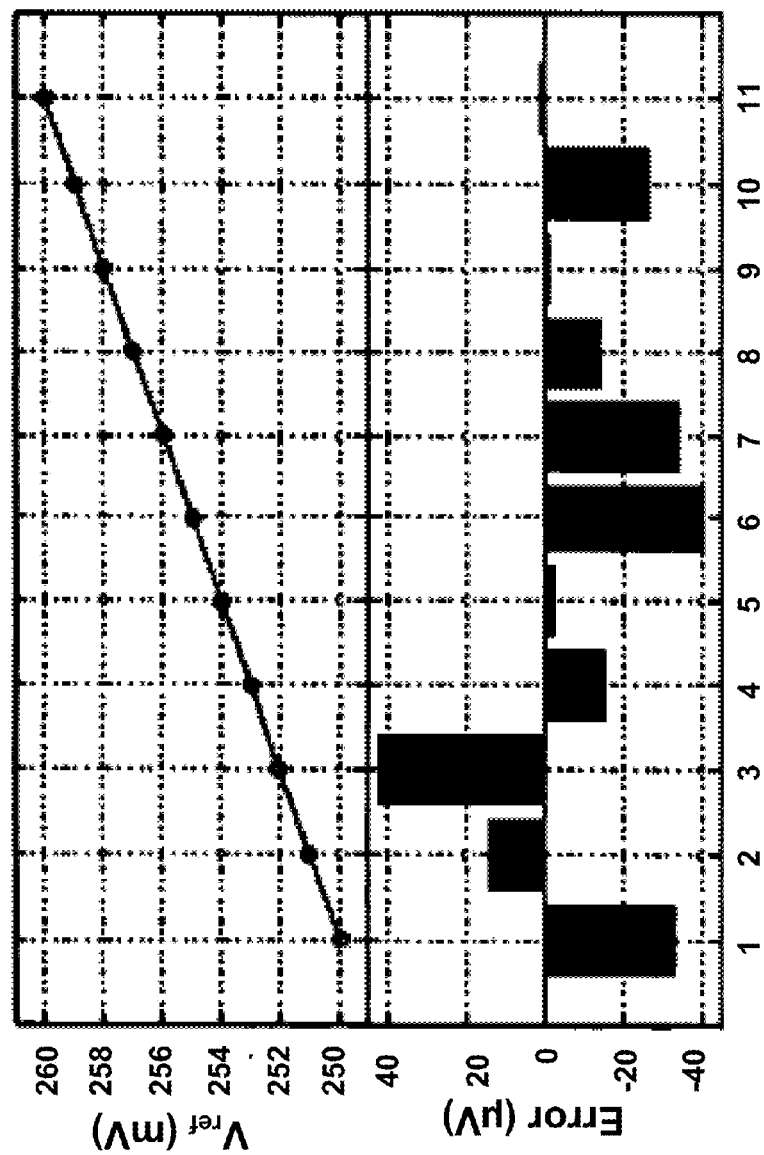
FIG. 4C an exemplary embodiment of the voltage reference device 100 with the reference voltage programmed in steps of 1 mV from a value of 0.25V to 0.26V, as well as the resulting typical errors (measured value-target value).

FIG. 4C an exemplary embodiment of the voltage reference device 100 with the reference voltage programmed in steps of 1 mV from a value of 0.25V to 0.26V, as well as the resulting typical errors (measured value-target value). As shown in FIG. 4C, the maximum deviation error provided by an exemplary embodiment of the voltage reference device 100 is around ±40 μV. Thus, an exemplary embodiment of the voltage reference device 100 demonstrates the high accuracy resulting from the programmable nature of the voltage reference device 100. The diagram provided in FIG. 4C illustrates the change of the floating-gate voltage, which is due to programmed floating-gate charge, as a change in the threshold voltage between the two floating-gate transistors. This difference in threshold voltages would be the difference between the two floating-gate voltages. Those of skill in the art can appreciate that one can consider a floating-gate transistor to be similar to a standard CMOS transistor with a programmable threshold voltage.

The data in FIG. 4C is one typical representative plot of an exemplary embodiment of the voltage reference device 100. In alternative embodiments, moving the voltage reference from 50 mV to 600 mV can result in smaller errors in the reference voltage.

Figure 5:
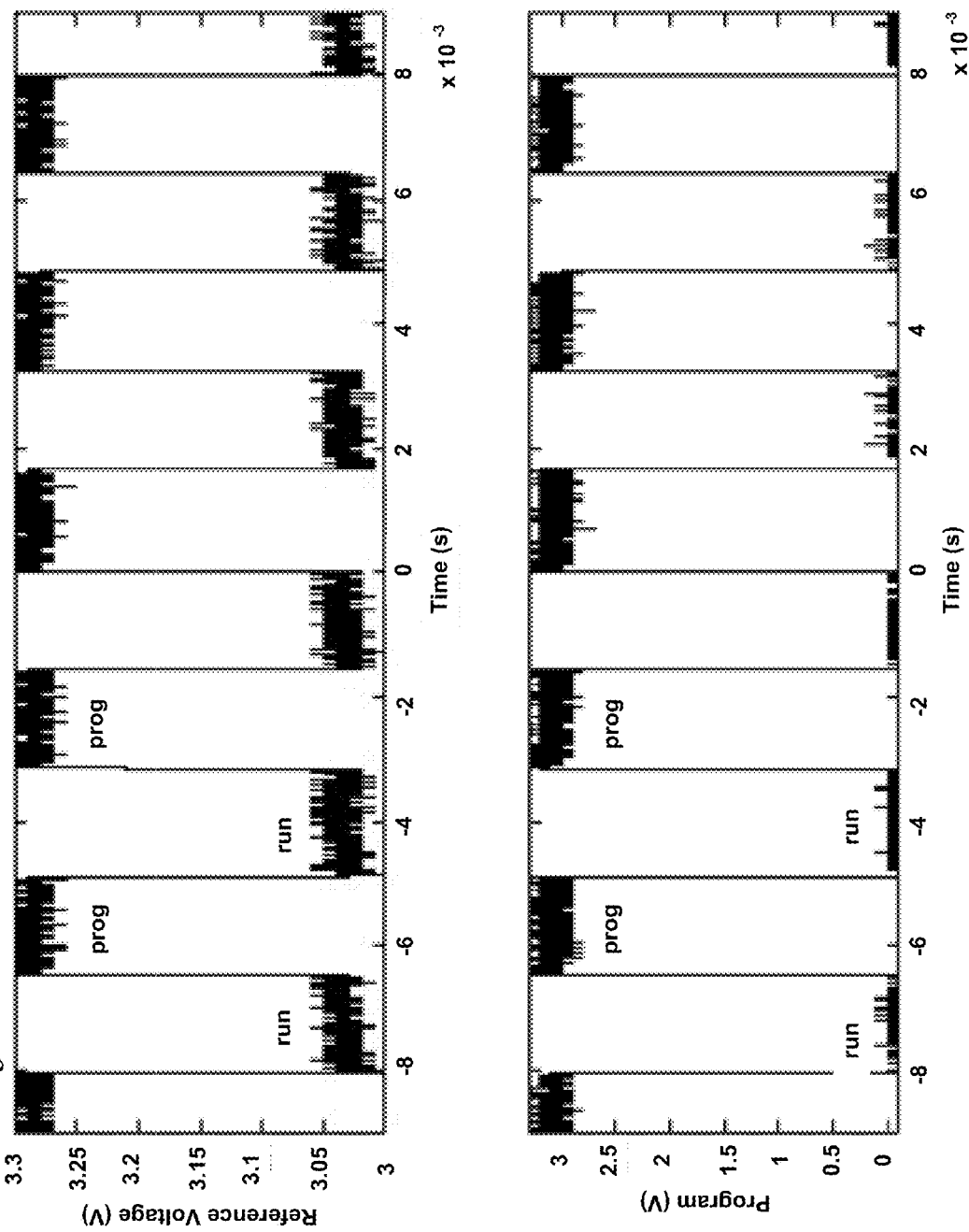
FIG. 5 illustrates the output of an exemplary embodiment of the voltage reference device 100 being switched between program mode and run mode.

FIG. 5 illustrates the output of an exemplary embodiment of the voltage reference device 100 being switched between program mode and run mode. As shown in FIG. 5, the output reference voltage of an exemplary embodiment of the voltage reference device 100 can return to the same reference voltage each time the reference 100 is switched back into run mode.

An exemplary embodiment of the voltage reference device 100 provides a relatively small overall size, which can enable many references 100 to be used on a single IC. The programming infrastructure of an exemplary embodiment of the voltage reference device 100 can provide a current (or sometimes voltage) measurement circuit. Furthermore, an exemplary embodiment of the voltage reference device 100 can include the infrastructure to apply the resulting gate and drain voltages during programming, the circuitry or state machine to determine the size of the drain voltage pulse during injection, and potentially the circuitry to supply the higher programming voltages. For example, and not limitation, when ported to a 0.35 µm CMOS process these additional components can consumes less than 1 mm² area for programming thousands of floating-gate devices.

In some embodiments, the voltage reference device 100 depicted in FIG. 3B can be used as a current reference utilizing the resulting reference voltage across a linear or nonlinear load resistor. As shown in FIG. 3B, this load device can be configured as part of an exemplary embodiment of the voltage reference device 100. The resulting reference current, set to $V_{ref}/R1$, can be mirrored out to a number of circuits using either floating-gate or non-floating-gate current mirrors.

Figure 6:
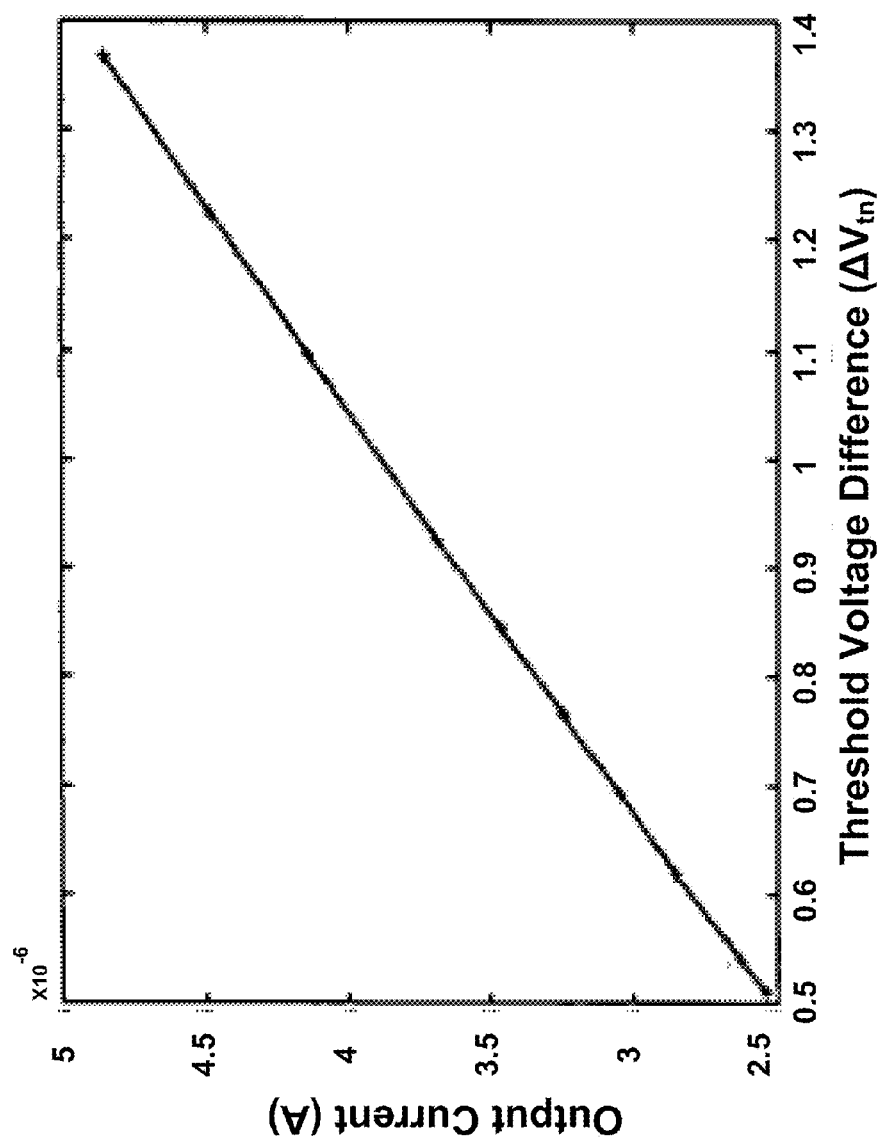
FIG. 6 provides an illustration of the reference current of an exemplary embodiment of the voltage reference device 100.

FIG. 6 provides an illustration of the reference current of an exemplary embodiment of the voltage reference device 100. The data set illustrated in FIG. 6 provides the reference current of an exemplary embodiment of the voltage reference device 100 measured at R1 on the reference 100, versus the programmed difference in charge, shown through the effective difference in threshold voltages. The current through this circuit can be determined by the resistor size and can be directly proportional to $V_{ref}$, and not proportional to $U_T$ (subthreshold bias currents), as typical for conventional reference devices.

The temperature dependence of an exemplary embodiment of the voltage reference device 100 is primarily made up of the temperature dependence of the resistor or resulting load element configured with the reference 100 circuit. In an exemplary embodiment of the voltage reference device 100, the temperature coefficients of a polysilicon or active diffusion resistor can be in the range of 1000 to 1500 ppm/° C. In some embodiments, on-chip resistor value could change by 20% between production runs. This variation in resistor value may have a negligible effect on the reference voltage, but can directly change the reference current proportionally by the resistor value change. Those of skill in the art will appreciate that this variation can be overcome by measuring the resulting reference current and programming a small change to achieve the desired reference current.

In an exemplary embodiment of the voltage reference device 100, the floating-gate current mirrors enable programming of the ratio of the output current(s). For example and not limitation, a current mirror in an exemplary embodiment of the voltage reference device 100 can be programmed with an exact gain equal to 1 over a wide temperature range by programming out the threshold voltage mismatch contributions. Those of skill in the art will appreciate that one can easily achieve different gains by altering the ratio of the size of the transistors. In an exemplary embodiment of the voltage reference device 100 in which a difference of charge is programmed in the floating-gate current mirror (programming a gain A in the current mirror), then the temperature dependence for subthreshold currents follows the relationship:

$$A(T) = A_o^{\frac{T_0}{T}}$$

where the nominal gain ($A_0$) occurs at the nominal temperature ($T_0$). For a current minor, programming with subthreshold currents show the strongest temperature dependence in this topology. For example, for device operation over a −40° C. to 120° C. temperature range, A(T) varies roughly 4% for A0 of 1.2, 0.4% for A0 of 1.02, 14% for A0 of 2, and 51% for A0 of 8. The mismatched non-floating-gate current mirror creates a similar temperature dependence.

A significant advancement presented by an exemplary embodiment of the voltage reference device 100 in an accordance with an exemplary embodiment of the present invention, is that the non-volatile memory of the floating-gate transistors 205 exhibit low long-term drift. More particularly, floating-gate transistors 205 exhibit good long-term retention due to the fact that the floating-gate can be almost completely surrounded by $SiO_2$. Those of skill in the art will appreciate that some negligible charge loss can occur in floating-gate transistors due to the phenomenon of thermionic emission. The amount of charge lost is a function of both temperature and time and is given by:

$$\frac{Q(t)}{Q(0)} = \exp\left[-tv \cdot \exp\left(-\frac{\phi B}{kT}\right)\right] \quad (5)$$

where, Q(0) is the initial charge on the floating-gate, Q(t) is the floating-gate charge at time t, v is the relaxation frequency of electrons in poly-silicon, $\phi B$ is the Si—$SiO_2$ barrier potential, k is the Boltzmann's constant and T is the temperature in Kelvins. Those of skill in the art will appreciate that the above equation shows floating-gate charge loss is a slow process that can be accelerate at high temperatures. Ignoring threshold voltage mismatch and κ mismatch we get from (3) and (4):

$$V_{ref}(t) = \frac{\kappa}{C_T}(Q_{m2}(t) - Q_{m1}(t)) \quad (6)$$

$$V_{ref}(t) = V_{ref}(0)\exp\left[-tv \cdot \exp\left(\frac{-\phi B}{kT}\right)\right]$$

In an exemplary embodiment, the measured voltage of the voltage reference device 100 is proportional to the charge difference between the floating-gate transistors. Furthermore, a fractional change in an exemplary embodiment of the voltage reference device 100 will be equal to the fractional change in charge of the floating-gate.

Table I below provides data obtained from an exemplary embodiment of the voltage reference device 100 relating to reference voltage drift.

TABLE I

REFERENCE VOLTAGE DRIFT

| | Temperature (° C.) | | |
|---|---|---|---|
| | 325 | 325 | 125 |
| Time (hrs) | 24 | 48 | 400 |
| $\frac{V_{ref}(T)}{V_{ref}(0)}$ | 0.967 | 0.953 | 0.998 |

As shown in Table 1, an exemplary embodiment of the voltage reference device 100 illustrates very little drift. For example, and not limitation, values for v and φB were found to be 55 ms$^{-1}$ and 0.618 eV respectively. A 400 μV drift over a period of 10 years at 25° C. can be estimated based on an extrapolation of equation (5).

Figure 7A:
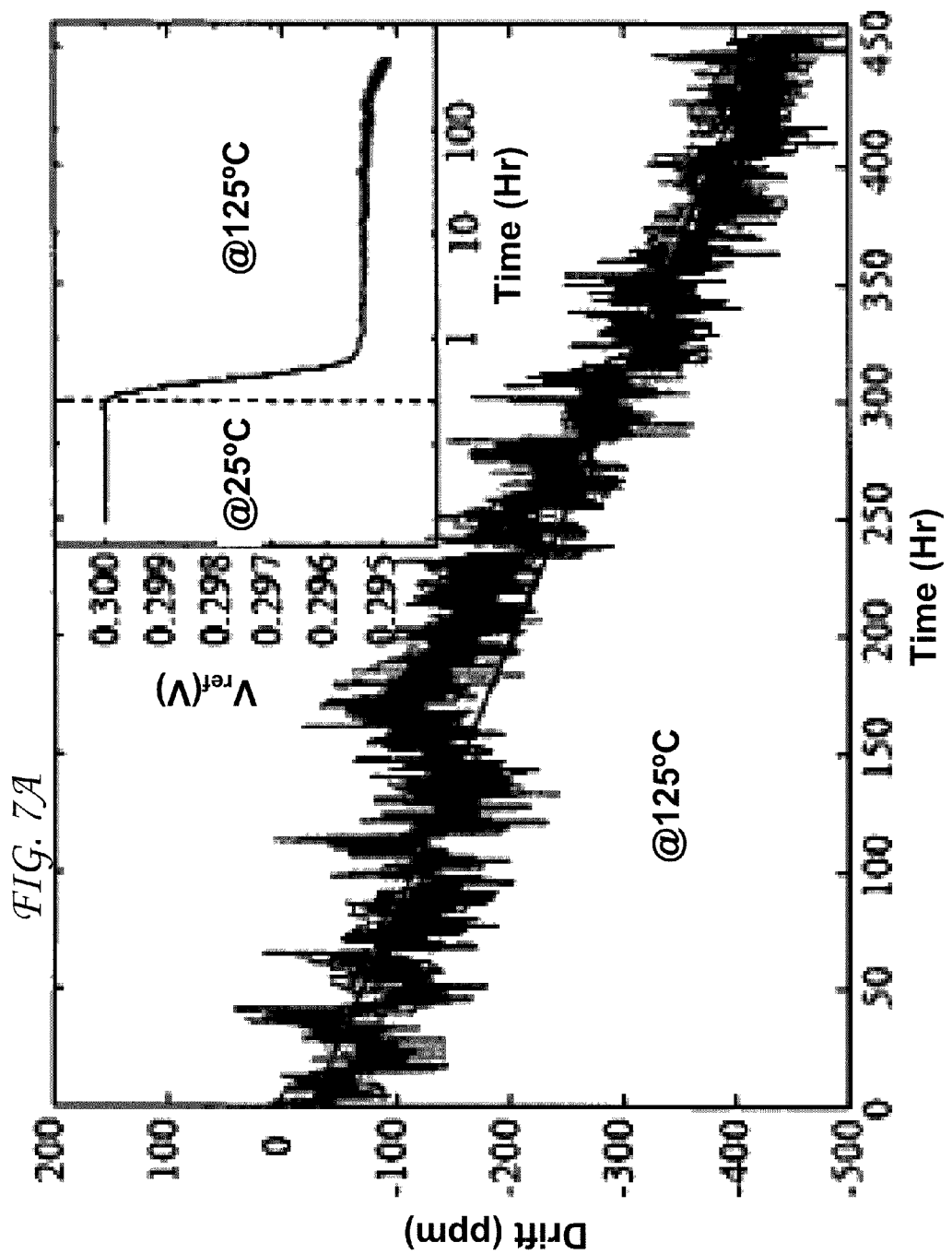
FIG. 7A shows $V_{ref}$ for an exemplary embodiment of the voltage reference device 100 held at 125° C. for a period of approximately 450 hrs with the voltage reference device 100 powered to $V_{dd}$ (=2.5V) and the rest of the programming circuitry disabled.

FIG. 7A shows $V_{ref}$ for an exemplary embodiment of the voltage reference device 100 held at 125° C. for a period of approximately 450 hrs with the voltage reference device 100 powered to $V_{dd}$(=2.5V) and the rest of the programming circuitry disabled. As shown in FIG. 7A, the exemplary embodiment of the voltage reference device 100 exhibited a net change of 400 μV. This powered test over 450 hrs at higher temperature (125° C.), which is equivalent, assuming accelerated temperature measurements, to 10 years powered at 38° C. The inset illustrated in FIG. 7A shows the same data on a logarithmic scale.

Figure 7B:
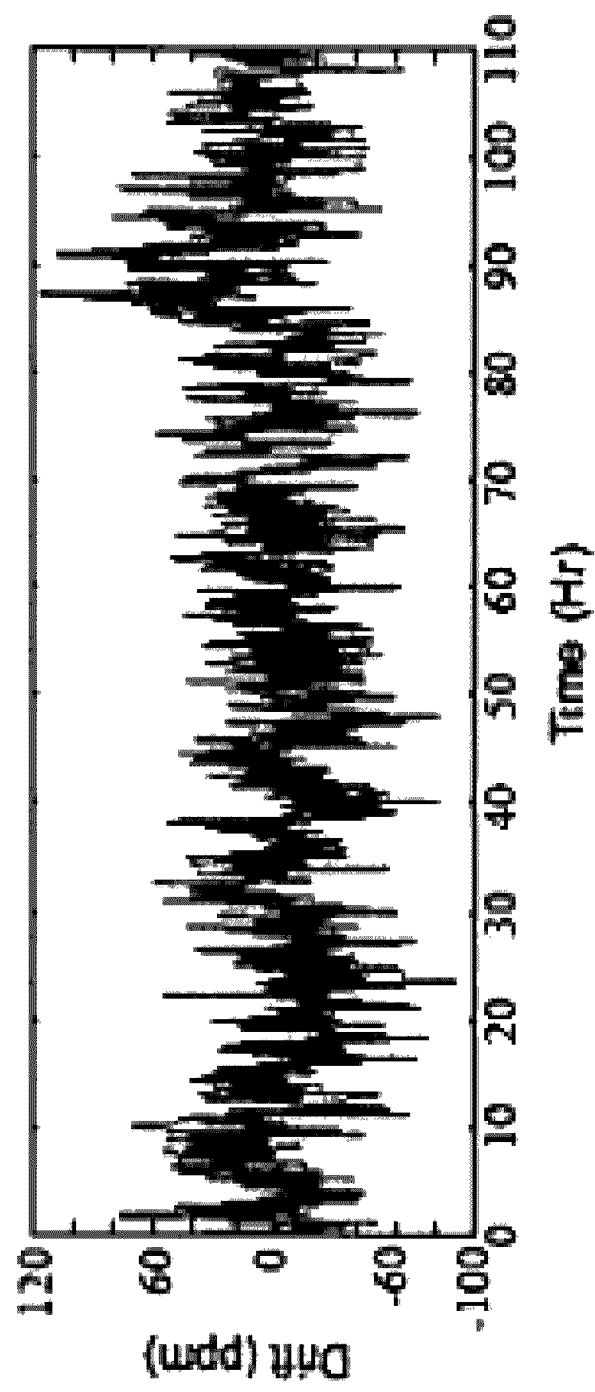
FIG. 7B shows $V_{ref}$ for an exemplary embodiment of the voltage reference device 100 held at 25° C. for a period of approximately 100 hrs.

FIG. 7B shows $V_{ref}$ for an exemplary embodiment of the voltage reference device 100 held at 25° C. for a period of approximately 100 hrs. As illustrated in FIG. 7B, the exemplary embodiment of the voltage reference device 100 illustrates a negligible change in the reference voltage over this 100 hour period.

Figure 8:
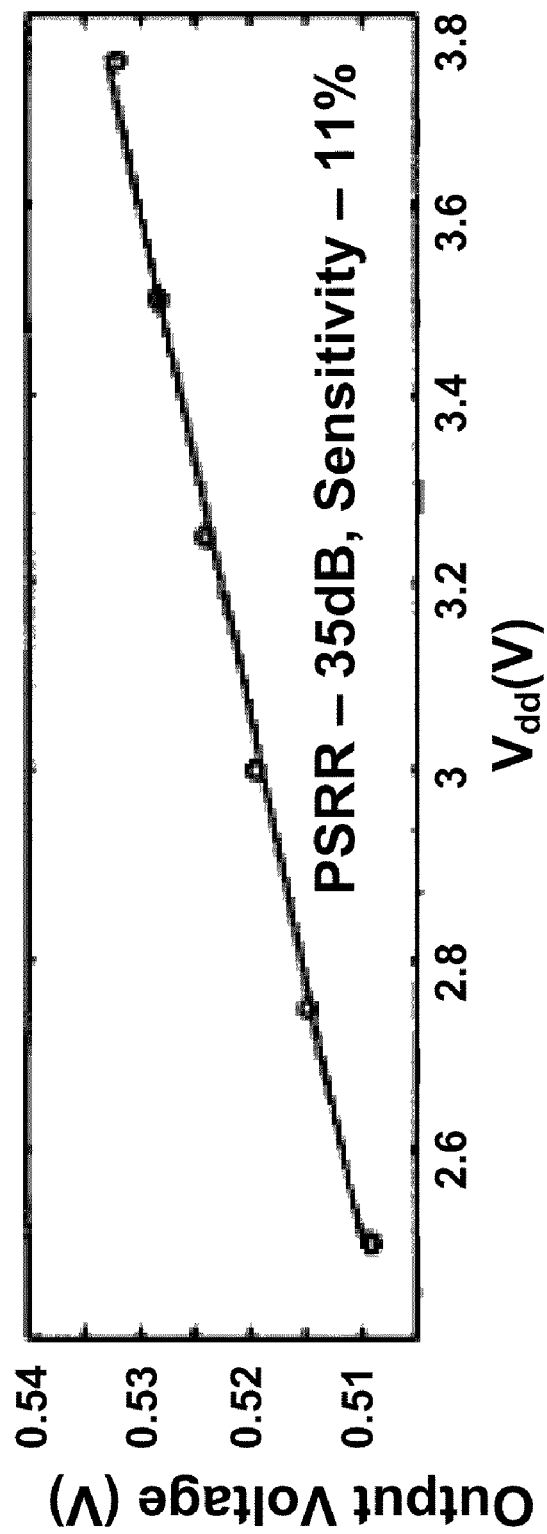
FIG. 8 shows low-frequency measurements of the reference voltage of an exemplary embodiment of the voltage reference device 100 versus power-supply voltage.

FIG. 8 shows low-frequency measurements of the reference voltage of an exemplary embodiment of the voltage reference device 100 versus power-supply voltage. As is typical with floating-gate reference circuits, the lowest power-supply rejection occurs at or near DC operation, and often improves with increasing frequency. As shown in FIG. 8, the Power-Supply Rejection Ratio (PSRR) for this exemplary embodiment of the voltage reference device 100 was measured as −35 dB, with the resulting power supply sensitivity, defined as percentage change in the reference output voltage to percentage change in the power supply voltage, measured at 11% for a 521 mV reference. Total output noise for this exemplary embodiment of the voltage reference device 100 was measured as roughly 20 μV$_{rms}$ of noise which was nearly constant 200 nV/rtHz when viewed over a 10 kHz bandwidth. The following paragraphs describe the analytical analysis of these elements, as well as discussion on modifying this design for desired specifications.

Figure 9A:
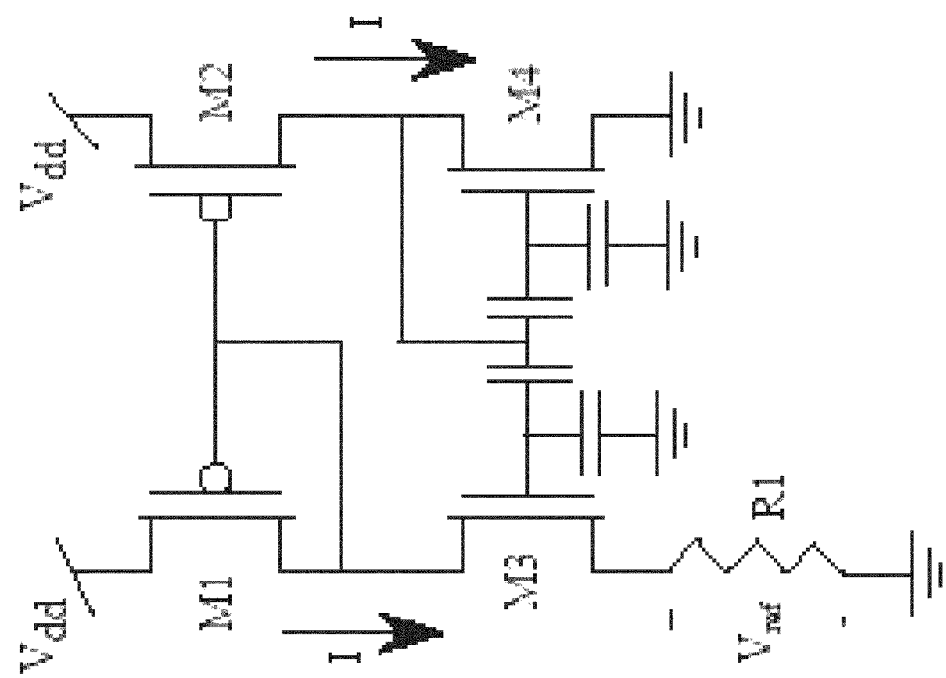
FIGS. 9A and 9B show an exemplary embodiment of the voltage reference device 100.
Figure 9B:
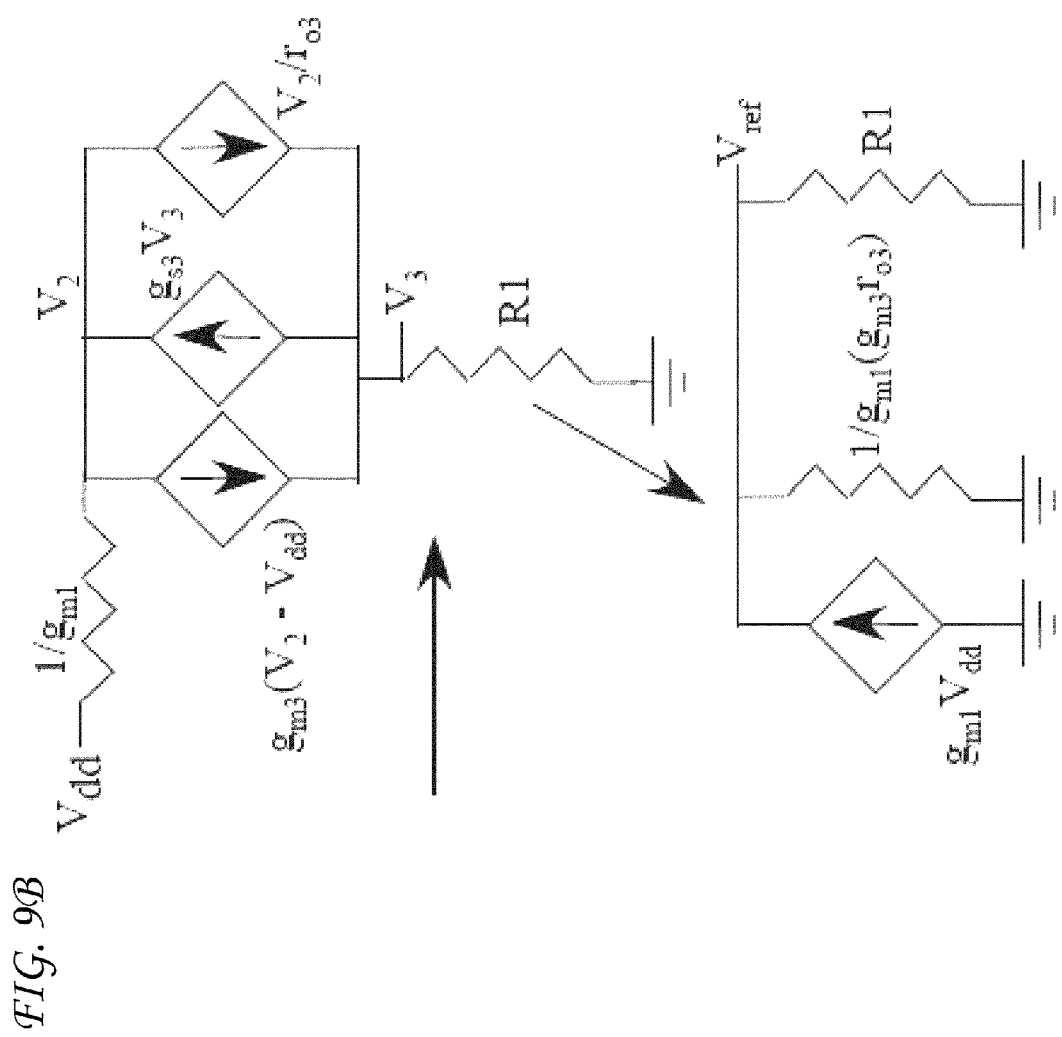

FIGS. 9A and 9B show an exemplary embodiment of the voltage reference device 100. For the exemplary embodiment of the voltage reference device 100 shown in FIG. 9(a), $V_{ref}$, which also sets the bias current, depends upon power supply ($V_{dd}$) as:

$$V_{ref} = \frac{V_{dd}}{(g_{s3}r_{o3})}$$

where $g_{S3}$ is the source conductance of M3, $r_{o3}$ is the drain resistance of M3, and we assume M3 and M4 are matched devices. Given that M3 and M4 are floating-gate devices, the overlap capacitance decreases the drain resistance through feedback to the gate terminal as:

$$\text{subthreshold}: r_o = \frac{C_T U_T}{\kappa I C_{ov}}, \text{ anr} \quad (7)$$

$$\text{abovethreshold}: r_o = 2\left(\frac{V_{on}}{\kappa I}\right)\left(\frac{C_T}{C_{ov}}\right)$$

where $V_{on}$ is the above threshold overdrive voltage. Since the overlap capacitance effects are smaller than the channel length modulation effects, $V_{ref}$ varies with $V_{dd}$ in the exemplary embodiment as:

$$V_{ref} = \frac{\kappa C_{ov}}{C_T} V_{dd} \quad (8)$$

The measured power-supply rejection can be consistent with the ratio of the overlap capacitance to the total floating-gate capacitance for this exemplary embodiment of the voltage reference device 100. This line regulation is often not sufficient in many applications but can often be easily improved, by the gain of a transistor ($g_s r_o$) by cascoding the non floating-gate current minor, which has no impact on the zeroth order behavior on the reference voltage.

The required headroom for this exemplary embodiment of the voltage reference device 100 requires that M3 have sufficient drain-to-source voltage to remain in saturation, plus the M1 gate voltage required to support the bias current, plus $V_{ref}$. For subthreshold bias currents, the drain-to-source voltage required for M3 of an exemplary embodiment of the voltage reference device 100 should be greater than 100 mV (4 U$_T$). For example, and not limitation, a $V_{dd}$=1V can provide proper operation for an exemplary embodiment of the voltage reference device 100 with 30 nA bias current in a 0.35 μm CMOS process for $V_{ref}$ of 400 mV (or less).

For above-threshold bias currents, M3 drain-to-source voltage can be greater than the transistor overdrive voltage, M1 gate voltage can be greater than a threshold voltage and transistor overdrive voltage. For a reference with 200 mV gate overdrive voltage ($V_{TO}$ at 0.6V), with $V_{dd}$=1.5V, we get proper operation for a reference for $V_{ref}$ of 500 mV (or less).

Figure 9C:
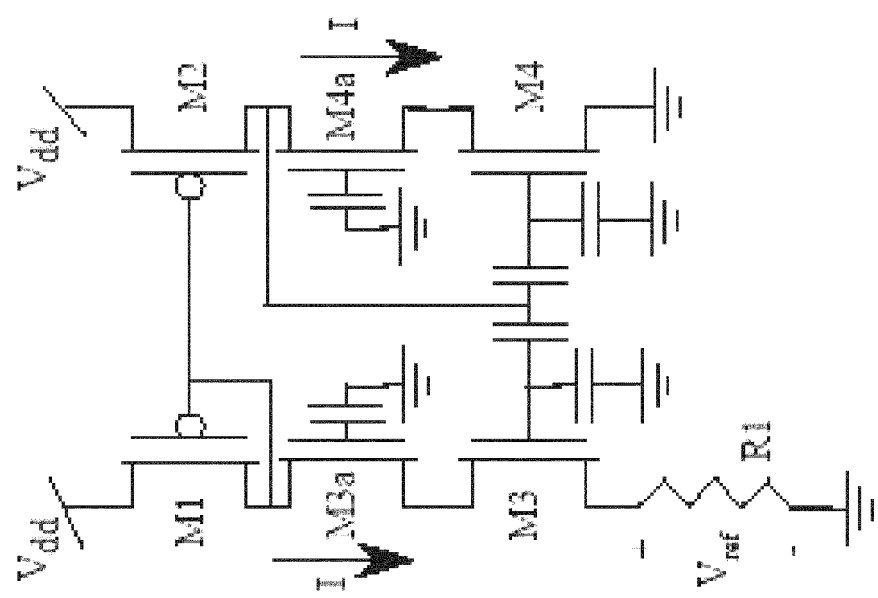
FIG. 9C shows an exemplary embodiment of the voltage reference device 100 that provides an improved PSRR by adding cascode transistors to M3 and M4, which result in higher output resistances for these elements by a factor of the maximum gain of that transistor.

FIG. 9C shows an exemplary embodiment of the voltage reference device 100 that provides an improved PSRR by adding cascode transistors to M3 and M4, which result in higher output resistances for these elements by a factor of the maximum gain of that transistor. Cascode transistors require bias voltage, which is often achieved at the cost of additional headroom. Cascodes can be programmed as well if desired to further account for mismatch, as similar to the folded cascode amplifier we presented previously, but the overlap capacitance can decrease some of the improvement by using this topology. If we use similar floating-gate devices to M3 and M4 for the cascode devices, M3a and M4a, respectively, then we get $$V_{ref} = \left(\frac{\kappa C_{ov}}{C_T}\right)^2 V_{ddi} \quad (9)$$

for similar devices used in this circuit, the PSRR would increase to 70 dB from 35 dB. We can increase C$_T$ relative to C$_{ov}$, costing additional area, as well as keeping floating-gate MOSFET devices to the minimum necessary width, thereby minimizing C$_{ov}$. The resulting effect on the biasing would, in the best biasing case (which is achievable through programming), increase the required $V_{dd}$ by 100 mV (subthreshold) or a transistor overdrive voltage (above-threshold).

In an exemplary embodiment, similar small-signal techniques to equation (9) can be used to analytically compute $V_{ref}$ noise levels. Thus, the resulting noise from the transistors in an exemplary embodiment can be computed as:

$$\hat{v}_{ref}^2 = \frac{(\hat{i}_1^2 + \hat{i}_2^2 + \hat{i}_3^2 + \hat{i}_4^2)}{g_{s3}} = \frac{4\hat{i}_3^2}{g_{s3}}$$

Where $\hat{i}1$, $\hat{i}2$, $\hat{i}3$, and $\hat{i}4$ are the noise sources generated by M1, M2, M3, and M4, respectively. As all transistors can have an equal bias current in an exemplary embodiment, each element can contribute an equal amount of thermal noise. The thermal noise of an exemplary embodiment can be modeled in an exemplary embodiment as $\hat{i}_3^2 = 2qI_{bias}\Delta f$ for each saturated device. In an exemplary embodiment in which all four transistors are operated with subthreshold currents, the resulting noise including the resistor noise ($I_{bias} = V_{ref}/R1$) is:

$$\hat{v}_{ref}^2 = \sqrt{4q\Delta fR1U_T\left(\frac{2U_T}{V_{ref}} + 1\right)},$$

In an exemplary embodiment in which all four transistors are operated with above threshold currents, the resulting noise is:

$$\hat{v}_{ref}^2 = \sqrt{4q\Delta f\left(\frac{4}{K_{3K3}} + U_TR1\right)},$$

For exemplary embodiments in subthreshold operation, the resistor noise tends to dominate the noise performance, particularly for larger $V_{ref}$. For exemplary embodiments in above threshold operation, the result is a combination of transistor and resistor noise, depending upon the transistor sizing. In an exemplary embodiment with a measured noise level with R1=150 kΩ (somewhat above-threshold biasing currents), the thermal noise consisted of 85% of the measured noise (measured from 10 Hz to 10 kHz). The remaining noise in this exemplary embodiment can come from 1/f noise, with a noise corner of 200 Hz. Those of skill in the art will appreciate that 1/f noise can be reduced by increasing the active area of the transistors.

Figure 10A:
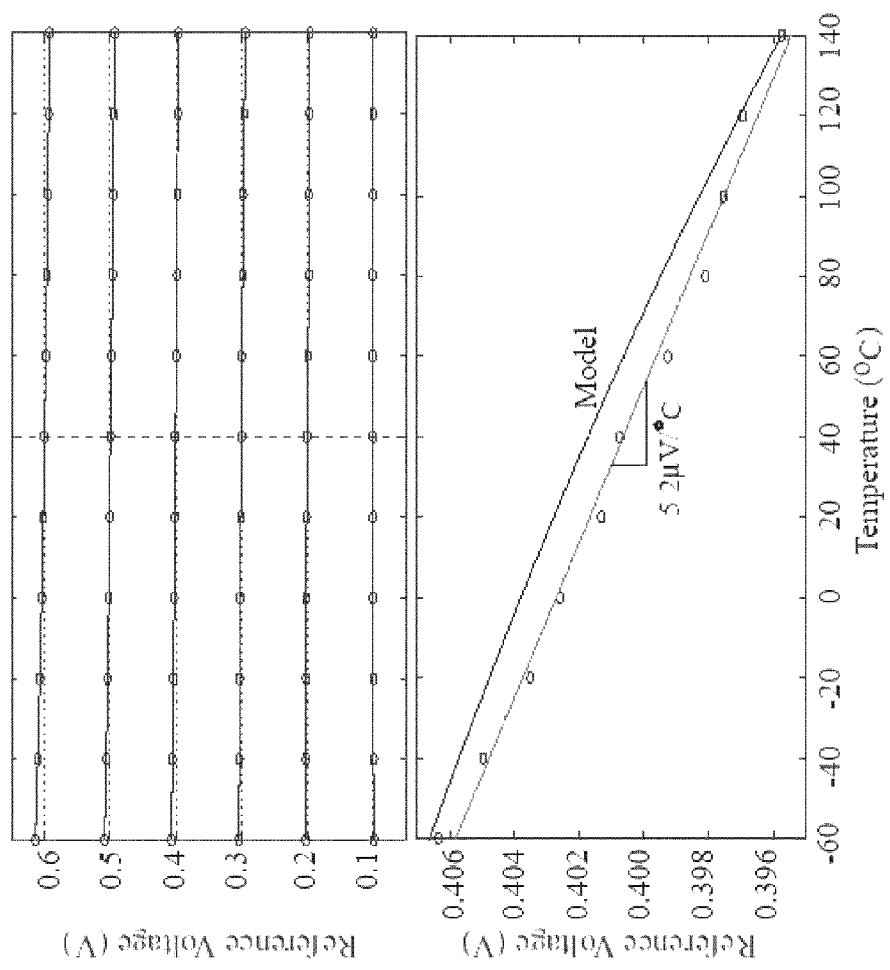
FIG. 10A shows experimental results for the temperature dependence of an exemplary embodiment of the voltage reference device 100.
Figure 10B:
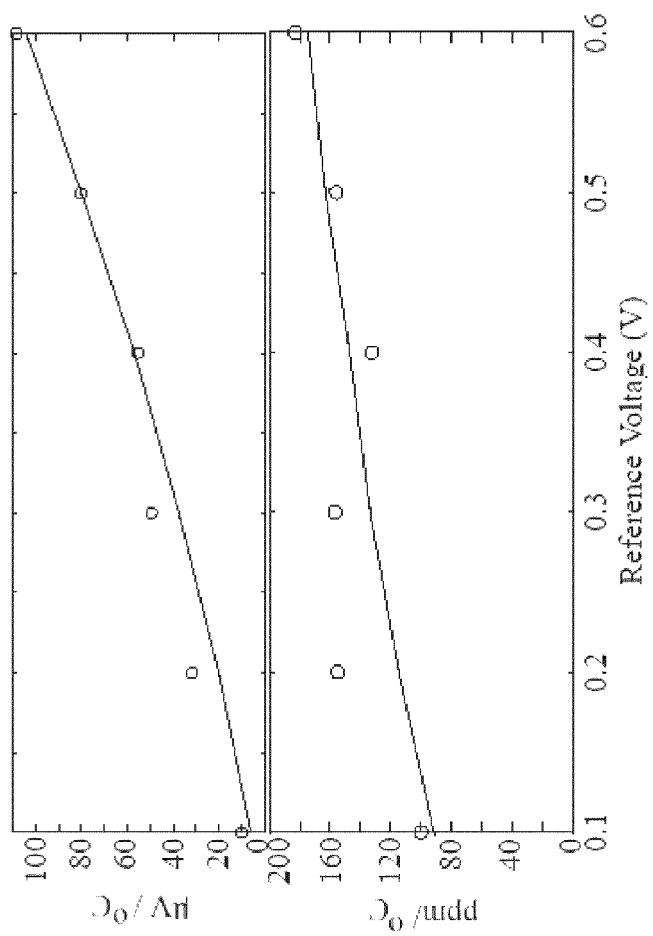
FIG. 10B shows additional experimental results for the temperature dependence of an exemplary embodiment of the voltage reference device 100.

FIG. 10A shows experimental results for the temperature dependence of an exemplary embodiment of the voltage reference device 100. The exemplary embodiment of the voltage reference device 100 used to generate the results graphed in FIG. 10A was programmed to five different values (@40° C.) ranging from 100 mV to 500 mV and measured across temperature from −60° C. to 140° C. A more detailed behavior is provided in FIG. 10A, illustrating the temperature dependence of $V_{ref}$=0.4V is shown. As shown in FIG. 10A, the plot of exemplary embodiment of the voltage reference device 100 with temperature can be linear over the −60° C. to 140° C. temperature range. FIG. 10B shows additional experimental results for the temperature dependence of an exemplary embodiment of the voltage reference device 100.

FIG. 10B shows the temperature sensitivity against $V_{ref}$ of an exemplary embodiment of the voltage reference device 100 of the data shown in the previous plots. As shown in FIG. 10B, a maximum sensitivity of 110 μV/° C. can be obtained for the exemplary embodiment with $V_{ref}$=0.6 V (183 ppm/° C.), while a minimum sensitivity of 10 μV/° C. can be obtained for the exemplary embodiment with $V_{ref}$=0.1V (100 ppm/° C.). For the exemplary embodiment of the voltage reference device 100 with a $V_{ref}$=0.4V, the reference displays a temperature coefficient of 53 μV/° C. (133 ppm/° C.).

By relying on equations (3) and (4), it has been determine that the temperature sensitivity of some embodiments of the voltage reference device 100 can come from capacitor sensitivity with temperature, κ sensitivity with temperature, or κ mismatch, which introduces additional terms into equation (3). As all of these terms have small temperature dependencies, the result can be the temperature effects of these physical terms. For example, and not limitation, double poly capacitors typically have temperature sensitivities in the range of 20 ppm, so initially one would expect these terms to have small effect. The ratio of the oxide capacitances in κ and CT can have an equal to lower temperature dependence. Therefore, the temperature dependence in some embodiments of the voltage reference device 100 can result from the temperature sensitivity of the depletion capacitance (CD).

In an exemplary embodiment, κ is the capacitive voltage divider formed by the series combination of the oxide capacitance ($C_{ox}$) and $C_D$ that couples the gate (and substrate) voltage into the surface potential (Ψ). Using a MOS capacitor formulation we get the depletion capacitance in subthreshold region (defined as a few UT away from flatband (Vfg) and threshold (VT) voltages) as $$C_D = \sqrt{\frac{q \in_{si} N_A}{\Psi - U_T}}, \tag{10}$$

where NA is the nFET substrate doping. Taking a typical Ψ for a 1 to 10 nA current (Ψ≈0.5V), the CD temperature change is 94 ppm/° C., resulting in a κ temperature change less than 28 ppm/° C.; the temperature dependence of this system is small. If the source voltage is not at the substrate potential, the variation in CD is even lower. The depletion capacitance in above threshold region has minimal change from its value at VT due to the small change in hi; therefore we model CD as $$C_D = \sqrt{\frac{q \in_{si} N_A}{2\Phi_f}} \tag{11}$$

where Φf, the Fermi potential of the bulk, is UTln(NA/ni) that yields 2Φf=Eg−UTln(NCNV/NA), where Eg is the bandgap voltage, ni is the intrinsic carrier concentration, and NC,NV are related to the density of states in the conduction and valence bands, respectively.

Recall that VT=Vfb+2Φf/κ; therefore, one expects 2Φf exhibits a linear temperature dependence of −1 mV/° C. to −2 mV/° C., and VT exhibits a linear temperature dependence of −1 mV/° C. to −4 mV/° C.

The above-threshold CD temperature dependence is roughly 500-700 ppm/° C., resulting in a κ dependence of 60-150 ppm/° C. Also remember that κ for above threshold currents is an average value over the entire MOS capacitor, and therefore the resulting κ tends to be predictably higher than the subthreshold levels would predict.

Further, we consider the effect of mismatched values of κ between our two devices. Modifying (3) for a mismatch in κ, yields the expression $$V_{ref} = -k_1(V_{dd} - V_{fg1} - V_{T1}) + k_2(V_{dd} - V_{fg2} - V_{T2})$$

$$V_{ref} = k_2(V_{fg1} - V_{fg2} + V_{fb1} - V_{FB2}) - \Delta k(V_{dd} - V_{fg1} - V_{fb1}) \quad (12)$$

where $\Delta\kappa = \kappa_1 - \kappa_2$, and remembering that $VT1 = Vfb1 + 2\Phi f/\kappa_1$, and $VT2 = Vfb2 + 2\Phi f/\kappa_2$. All voltages are temperature independent or very weakly temperature dependent (flat-band voltages, Vfb1 and Vfb2); therefore the temperature dependence comes from t and capacitor shifts. For our device, M1 and M2 have the same well terminal (Vdd), roughly same bias current, but different source voltages; therefore one might expect that the resulting values for κ would be different due to the different size depletion regions.

$$C_{D1} = \sqrt{\frac{q \in_{si} N_A}{2\Phi_f + V_{ref}}}$$

$$C_{D2} = \sqrt{\frac{q \in_{si} N_A}{2\Phi_f}}$$

Therefore, the temperature dependence gives $$V_{ref} = k_2(V_{fg1} - V_{fg2} + V_{FB1} - V_{FB2}) - \left(\frac{1}{k_2} - 1\right)$$

$$\left(1 - \frac{1}{\sqrt{1 + (V_{ref})/(2\Phi_f)}}\right)(V_{dd} - V_{fg1} - V_{FB1})$$

the first term is the mismatch independent terms (in bias voltage); the second term results from bias-dependent mismatch of κ. FIG. 10b shows the experimental measurements of the temperature effects along with the analytical model described above. We see good agreement between the models; we see that having the well terminal tied to Vdd gives temperature dependences of 100 ppm/° C. to 183 ppm/° C., where we would predict a Vref independent temperature dependences of 50 ppm/° C. to 70 ppm/° C.

One could also model non-bias-dependent mismatch of κ, but typically κ matches better than 1% even for small MOSFET transistors. Further, mismatches between the current minor flatband voltages, also reflect directly into the difference of flatband voltages; for subthreshold operation, we have a ratio of κ between nFETs and pFETs, where for above-threshold operation we have the ratio of the mobilities *(W/L) of the devices between the nFET and pFET devices.

In general, transistor size dimensions are much smaller than threshold voltage mismatch effects, whether subthreshold or low-overdrive above-threshold operation. When using subthreshold bias current, one achieves a significantly smaller temperature effect, described by $$V_{ref} = k_2(V_{fg1} - V_{fg2} + V_{FB1} - V_{FB2}) - \left(\frac{1}{k_2} - 1\right)$$

$$\left(1 - \frac{1}{\sqrt{1 + (V_{ref})/(\Psi - U_T)}}\right)(V_{dd} - V_{fg1} - V_{FB1});$$

therefore one would ideally like to operate these references with subthreshold currents through the floating-gate devices whenever possible.

The temperature sensitivity would decrease by a factor of 2 (in ppm/° C.) by connecting the well terminal to the reference voltage for M1, and makes the variability much less dependent on Vref. Using floating-gate pFET devices, this result is a tradeoff between smaller reference area and improved temperature sensitivity. Using floating-gate nFET devices, programmed using indirect programming schemes, the option of tying Vref to the bulk voltage is usually not available; therefore, this reference shows the performance achieved by this scenario.

We herein present a compact, programmable voltage or current reference circuit that exhibits a low temperature coefficient. We present a programmable reference occupying 0.0022 mm2 (52 μm×42 μm) (excluding buffers) area in a 0.35 μm CMOS technology.

FIG. 1 shows the die micrograph of the voltage reference device 100 fabricated in a 0.35 μm CMOS technology. The small significant area enables applications that require a number of references on chip. Table II below summarizes the performance of the proposed reference circuitry. The reference circuitry has been programmed to output voltages from 50 μV to 0.6V (and wider ranges are possible), thereby demonstrating the programmable nature of reference circuit to 40 μV accuracy that simultaneously is insensitive to temperature effects.

TABLE II

SUMMARY OF REFERENCE PERFORMANCE

| Parameter | Value |
| --- | --- |
| Supply Voltage | 2.5 V |
| Technology | 0.35 μm CMOSV |
| Voltage Range | 50 mV-600 mV |
| Voltage Drift with Temperature | 130 ppm/° C. for 0.4 V reference |
| Initial Accuracy | ±40 μW |
| Power Dissipation ($V_{ref}$ = 0.5 V) | 50 μW |
| Area | 52 μm × 42 μm |

Over the 50 μV to 0.6 V programmed voltage range, the reference temperature sensitivity is less than 100 μV/° C. and 180 ppm° C. over a 200° C. range. The long-term drift in the programmed value is negligible on account of the excellent charge retention capabilities of floating-gate transistors. A worst case voltage drift of 400 μV over a period of 10 years at 25° C. has been extrapolated from accelerated life-time tests.

Overall chip performance is summarized and compared against reported voltage references in Table III below. The required area for this reference circuit is significantly smaller than other references reported, whether fixed or programmable, enabling many references to be utilized on an IC, consistent with large-scale analog integration. From the table, we offer a fixed reference value based on device parameters were trimming is required. A programmable reference based on charge is used in the prior art, although temperature reference data is only reported for two programmed points, 1.25V and 5V on ICs optimized for these operating points. Unlike the prior art, the proposed reference easily scales across process, can be easily programmed over a range of voltages (and currents), and allows for low voltage supply.

TABLE III

Comparison of Voltage References

| Parameter | This Work | Leung et al. (22) |
|---|---|---|
| Technique | Floating-Gate | Weighted $\Delta V_{GS}$ |
| Technology | 0.35 μm CMOS | 0.6 μm CMOS |
| Min. Supply Voltage | 2.5 V | 1.4 V |
| $V_{ref}$ Range | [50 mV-600 mV] measured | fixed-309.31 mV |
| Temperature Coefficient | [100 ppm/° C.-183 ppm/° C.] ($V_{ref}$ = [50 mV-600 mV]) | 36.9 ppm/° C. (trim) |
| Temperature Range | −60 to 140° C. | 0 to 100° C. |
| Voltage Drift @ 10 years | 400 ppm | NA |
| Initial Accuracy | ±40 μV | ±19.26 mV |
| Power Dissipation | 25 μW (5 μA bias) ($V_{ref}$ = 0.5 V) | 13.6 μW ($V_{pp}$ = 1.4 V) |
| Area | 0.0022 mm² | 0.55 mm² |

| Parameter | Leung et al. (23) | Buck et al. (24) | Ahuja et al. (25) |
|---|---|---|---|
| Technique | CMOS Bandgap | Bandgap without Resistors | Floating-Gate |
| Technology | 0.6 μm CMOS | 0.6 μm CMOS | 1.5 μm CMOS |
| Min. Supply Voltage | 0.98 V | 3.7 V | 2.7 V |
| $V_{ref}$ Range | fixed-603 mV | fixed-1.1195 V | 1.25 V, 5 V measured |
| Temperature Coefficient | 15 ppm/° C. (4 bit R trim) | 134 ppm/° C. (trim) | <1 ppm/° C. (5.0 V tuned only) |
| Temperature Range | 0 to 100° C. | 0 to 70° C. | −40 to 85° C. |
| Voltage Drift @ 10 years | NA | NA | <1000 ppm |
| Initial Accuracy | NA | ±0.5 mV | ±200 μV |
| Power Dissipation | 17.6 μW | 1.4 mW | 1.3 μW ($V_{pp}$ = 2.7 V) |
| Area | 0.24 mm² | 0.40 mm² | 1.6 mm² |

With the recent trends in transistor scaling, the need for sub-1V reference voltages with low temperature sensitivity and high initial accuracy is growing. In CMOS technology, the bandgap voltage reference implemented using parasitic bipolar junction transistors (BJTs) is the popular choice for implementing a voltage reference. The bandgap reference provides a stable known reference voltage, namely the energy bandgap of silicon. Typically, the bandgap reference is designed to achieve a first-order temperature cancellation that gives a zero temperature coefficient at a particular temperature. Mismatch between design components are corrected using a post-fabrication trim procedure while higher order temperature effects are reduced for by using schemes such as curvature correction. Although the bandgap reference is attractive and provides temperature coefficients in the range of 25-50 ppm/° C., it restricts the reference voltage to that of the energy bandgap of silicon (≈1.25 V) which is undesirable from the viewpoint of a sub-1V reference. Several techniques have been proposed for modifying the bandgap reference voltage to provide voltages less than the bandgap voltage of silicon. A known structure uses native nMOS transistors while those in other known structures are architectures that avoid low-threshold voltage devices.

In all these structures, the reference voltage is scaled using a ratio of resistors. These architectures require matched resistors with mismatch being addressed at the expense of area and costly post-fabrication schemes such as laser trimming. Also, all the above schemes restrict the output voltage to a single value that is set during the design phase.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. A voltage reference device comprising:
a first floating-gate transistor including a first source, a first drain, and a first gate, wherein the first gate is coupled to a first programming capacitor and a first input capacitor;
a second floating-gate transistor including a second source, a second drain, and a second gate, wherein the second gate is coupled to a second programming capacitor and a second input capacitor;
wherein a charge difference between the first floating-gate transistor and the second floating-gate transistor is a reference voltage; and
wherein the first drain and the first gate of the first floating-gate transistor and the second drain and the second gate of the second floating-gate transistor are enabled to be connected to a functional circuit for run-mode operation;
wherein the first drain and the first gate of the first floating-gate transistor and the second drain and the second gate of the second floating-gate transistor are enabled to be isolated from the functional circuit and connected to a programming circuit for programming.

2. The voltage reference device of claim 1, wherein the reference voltage can be modified by programming the first floating-gate transistor.

3. The voltage reference device of claim 2, wherein the reference voltage can be further modified by programming the second floating-gate transistor.

4. The voltage reference device of claim 1, wherein the first floating-gate transistor is enabled to be programmed by applying a hot-electron injection to the first gate.

5. The voltage reference device of claim 1, wherein the first floating-gate transistor is enabled to be programmed by applying a Fowler-Nordheim tunneling voltage to the first gate.

6. The voltage reference device of claim 5, wherein the application of a Fowler-Nordheim tunneling voltage to first floating-gate transistor can erase a charge on the first floating-gate transistor.

7. The voltage reference device of claim 1, wherein the voltage reference device is enabled to provide the reference voltage with a value less than 1 volt.

8. A method of programming a voltage reference device, comprising:
inserting charge into a first floating-gate transistor including a first source, a first drain, and a first gate, wherein the first gate is coupled to a first programming capacitor and a first input capacitor while the first drain and the first gate of the first floating-gate transistor is isolated from the functional circuit and connected to a programming circuit;
inserting charge into a second floating-gate transistor including a second source, a second drain, and a second gate, wherein the second gate is coupled to a second programming capacitor and a second input capacitor while the second drain and the second gate of the second floating-gate transistor is isolated from the functional circuit and connected to a programming circuit; and
measuring a reference voltage by determining a charge difference between the first floating-gate transistor and the second floating-gate transistor while the first floating gate transistor and the second drain and the second gate of the second floating-gate transistor are connected to a functional circuit for run-mode operation.

9. The method of programming a voltage reference device of claim 8, wherein the reference voltage can be modified by inserting additional charge or removing charge from the first floating-gate transistor.

10. The method of programming a voltage reference device of claim 9, wherein the reference voltage can be further modified by inserting additional charge or removing charge from the second floating-gate transistor.

11. The method of programming a voltage reference device of claim 8, wherein inserting charge involves applying a hot-electron injection to the first gate and the second gate.

12. The method of programming a voltage reference device of claim 8, further comprising the step of erasing the charge on the first floating-gate transistor by applying a Fowler-Nordheim tunneling voltage to the first gate.

13. The method of programming a voltage reference device of claim 8, further comprising the step of erasing the charge on the second floating-gate transistor by applying a Fowler-Nordheim tunneling voltage to the second gate.

14. The method of programming a voltage reference device of claim 8, wherein inserting the charge in the first floating-gate transistor and second floating-gate transistor can be down with accuracy with the value of the reference voltage being less than 1 volt.

15. A circuit comprising:
a first transistor comprising a first source, a first drain, and a first gate;
a second transistor comprising a second source, a second drain, and a second gate;
a third transistor comprising a third source, a third drain, and a third gate;
a fourth transistor comprising a fourth source, a fourth drain, and a fourth gate;
a first resistor coupled between the first source of the first transistor and a voltage source;
a first capacitor coupled between a tunneling voltage and the first gate of the first transistor;
a second capacitor coupled between the first gate of the first transistor and a first node;
a third capacitor coupled between the first node and the second gate of the second transistor;
a fourth capacitor coupled between the second gate of the second transistor and the tunneling voltage;
the voltage source coupled to the second source of the second transistor;
the second drain of the second transistor coupled to the first node and the fourth drain of the fourth transistor;
the third source of the third transistor coupled to a ground source;
the third gate of the third transistor coupled to fourth gate of the fourth transistor, the first drain of the first transistor, and the third drain of the third transistor; and
the fourth source of the fourth transistor coupled to the ground source.

16. The circuit according to claim 15, wherein the first, second, third and fourth gates of the first, second, third and fourth transistors are floating gates.

17. A reference device comprising:
a first floating-gate transistor including a first source, a first drain, and a first gate, wherein the first gate is coupled to a first programming capacitor and a first input capacitor;
a second floating-gate transistor including a second source, a second drain, and a second gate, wherein the second gate is coupled to a second programming capacitor and a second input capacitor; and
wherein a charge difference between the first floating-gate transistor and the second floating-gate transistor is a reference voltage;
wherein the first drain and the first gate of the first floating-gate transistor and the second drain and the second gate of the second floating-gate transistor are enabled to be connected to a functional circuit for run-mode operation;
wherein the first drain and the first gate of the first floating-gate transistor and the second drain and the second gate of the second floating-gate transistor are enabled to be isolated from the functional circuit and connected to a programming circuit for programming; and
wherein a current reference can be determined by loading a first resistor with the reference voltage.

18. The reference device of claim 17, wherein the reference current can be mirrored out to a plurality of circuits using a plurality of floating-gate transistor based current mirrors.

* * * * *